United States Patent
Lee et al.

(10) Patent No.: US 10,270,009 B2
(45) Date of Patent: Apr. 23, 2019

(54) LIGHT-EMITTING DEVICE AND LIGHT-EMITTING DEVICE PACKAGE HAVING SAME

(71) Applicant: LG INNOTEK CO., LTD., Seoul (KR)

(72) Inventors: Dae Hee Lee, Seoul (KR); Young Hoon Kim, Seoul (KR); Jung Hwan Son, Seoul (KR); Seung Il Lee, Seoul (KR); Jung Wook Lee, Seoul (KR); Jae Young Im, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/752,926

(22) PCT Filed: Aug. 18, 2016

(86) PCT No.: PCT/KR2016/009073
§ 371 (c)(1),
(2) Date: Feb. 15, 2018

(87) PCT Pub. No.: WO2017/034212
PCT Pub. Date: Mar. 2, 2017

(65) Prior Publication Data
US 2018/0240940 A1    Aug. 23, 2018

(30) Foreign Application Priority Data

Aug. 24, 2015 (KR) .................. 10-2015-0118776

(51) Int. Cl.
*H01L 33/20* (2010.01)
*H01L 33/26* (2010.01)
(Continued)

(52) U.S. Cl.
CPC ............ *H01L 33/405* (2013.01); *H01L 33/20* (2013.01); *H01L 33/26* (2013.01); *H01L 33/36* (2013.01);
(Continued)

(58) Field of Classification Search
CPC ......... H01L 33/20; H01L 33/44; H01L 33/46; H01L 33/60; H01L 33/405; H01L 33/36
See application file for complete search history.

(56) References Cited

U.S. PATENT DOCUMENTS

2011/0073889 A1   3/2011   Sugizaki et al.
2011/0079810 A1   4/2011   Albrecht et al.
(Continued)

FOREIGN PATENT DOCUMENTS

JP   2011-521461   7/2011
JP   2014-183295   9/2014
(Continued)

OTHER PUBLICATIONS

International Search Report (with English Translation) and Written Opinion dated Dec. 9, 2016 issued in Application No. PCT/KR2016/009073.
(Continued)

*Primary Examiner* — Ngan V Ngo
(74) *Attorney, Agent, or Firm* — Ked & Associates, LLP

(57) ABSTRACT

Disclosed in an embodiment is a light emitting device comprising: a light-emitting structure having a first semiconductor layer, an active layer under the first semiconductor layer, and a second semiconductor layer under the active layer; a first contact layer disposed under the light-emitting structure; a reflective layer disposed under the first contact layer; a first electrode layer including a capping layer disposed under the reflective layer; a second electrode layer electrically connected with the first semiconductor layer; a protective layer disposed at the outer peripheral portion between the capping layer and the light-emitting structure; a barrier layer at an outer side of the reflective layer and made of a metal different from that of the reflective layer; and a support member disposed under the capping layer.

20 Claims, 19 Drawing Sheets

(51) Int. Cl.
  *H01L 33/36*  (2010.01)
  *H01L 33/38*  (2010.01)
  *H01L 33/40*  (2010.01)
  *H01L 33/44*  (2010.01)
  *H01L 33/46*  (2010.01)
  *H01L 33/60*  (2010.01)
  *H01L 33/62*  (2010.01)

(52) U.S. Cl.
  CPC .............. *H01L 33/38* (2013.01); *H01L 33/44* (2013.01); *H01L 33/46* (2013.01); *H01L 33/60* (2013.01); *H01L 33/62* (2013.01); *H01L 2224/4809* (2013.01); *H01L 2224/48091* (2013.01)

(56) References Cited

U.S. PATENT DOCUMENTS

| | | | | |
|---|---|---|---|---|
| 2011/0193121 | A1* | 8/2011 | Jeong | H01L 33/405 257/98 |
| 2012/0205711 | A1* | 8/2012 | Jeong | H01L 33/0079 257/99 |
| 2013/0228744 | A1* | 9/2013 | Kazama | H01L 33/382 257/13 |
| 2014/0124731 | A1 | 5/2014 | Jeong | |
| 2014/0264413 | A1* | 9/2014 | Yamada | H01L 33/005 257/98 |
| 2014/0306247 | A1* | 10/2014 | Lee | H01L 33/387 257/88 |
| 2014/0319534 | A1 | 10/2014 | Miyachi et al. | |
| 2014/0361321 | A1* | 12/2014 | Saito | H01L 33/005 257/89 |
| 2014/0367637 | A1* | 12/2014 | Choi | H01L 33/22 257/13 |
| 2015/0155442 | A1* | 6/2015 | Chien | H01L 33/405 257/98 |
| 2015/0303352 | A1* | 10/2015 | Jeong | H01L 33/385 257/98 |
| 2016/0005930 | A1* | 1/2016 | Engl | H01L 33/405 257/98 |
| 2016/0365481 | A1* | 12/2016 | Katsuno | H01L 33/22 |
| 2017/0148946 | A1* | 5/2017 | Lee | H01L 33/22 |
| 2018/0130924 | A1* | 5/2018 | Ko | H01L 33/0079 |

FOREIGN PATENT DOCUMENTS

| | | |
|---|---|---|
| JP | 2014-216470 | 11/2014 |
| KR | 10-2014-0056976 | 5/2014 |
| KR | 10-2014-0122873 | 10/2014 |

OTHER PUBLICATIONS

Chinese Office Action dated Feb. 1, 2019 issued in Application No. 201680049310.X.

* cited by examiner

LIGHT-EMITTING DEVICE AND LIGHT-EMITTING DEVICE PACKAGE HAVING SAME

CROSS-REFERENCE TO RELATED PATENT APPLICATIONS

This application is a U.S. National Stage Application under 35 U.S.C. § 371 of PCT Application No. PCT/KR2016/009073, filed Aug. 18, 2016, which claims priority to Korean Patent Application No. 10-2015-0118776, filed Aug. 24, 2015, whose entire disclosures are hereby incorporated by reference.

TECHNICAL FIELD

The embodiment relates to a light emitting device.
The embodiment relates to a light emitting device package and a light unit having a light emitting device.

BACKGROUND ART

A light emitting diode (LED) has been extensively used as one of light emitting devices. The LED converts electrical signals into the form of light such as infra-red light, ultra-violet light, and visible light by using the characteristic of a compound semiconductor.

As the light efficiency of the light emitting device is increased, the light emitting device has been used in various fields such as a display device, a vehicle lamp, or various lighting devices.

DISCLOSURE

Technical Problem

The embodiment provides a light emitting device having a light emitting structure and a barrier layer on an outer peripheral portion of a reflective layer in a structure having the reflective layer under the light emitting structure.

The embodiment provides a light emitting device having a reflective layer and a barrier layer, which blocks the material constituting the reflecting layer from being migrated, on the lower peripheral portion of a light emitting structure.

The embodiment provides a light emitting device package having a light emitting device and a light unit.

Technical Solution

According to an embodiment, a light emitting device includes a light emitting structure including a first semiconductor layer, an active layer under the first semiconductor layer, and a second semiconductor layer under the active layer, a first electrode layer including: a first contact layer disposed under the light emitting structure; a reflective layer disposed under the first contact layer; and a capping layer disposed under the reflective layer, a second electrode layer electrically connected with the first semiconductor layer, a protective layer disposed at an outer peripheral portion of a region between the capping layer and the light emitting structure, a barrier layer disposed at an outer peripheral portion of the reflective layer, and a support member disposed under the capping layer.

According to an embodiment, a light emitting device includes a light emitting structure including a first semiconductor layer, an active layer under the first semiconductor layer, and a second semiconductor layer under the active layer, a first electrode layer including: a first contact layer disposed under the light emitting structure; a reflective layer disposed under the first contact layer; and a capping layer disposed under the reflective layer, a second electrode layer electrically connected with the first semiconductor layer under the first semiconductor layer, an insulating layer between the first electrode layer and the second electrode layer, a protective layer disposed at an outer peripheral portion of a region between the capping layer and the light emitting structure, and a barrier layer disposed at an outer peripheral portion of the reflective layer. The barrier layer includes metal different from metal of the reflective layer.

Advantageous Effects

The embodiment may prevent the migration of the metal layer disposed under the light emitting structure in the light emitting device.

The embodiment may provide a light emitting device strong for moisture.

The embodiment may prevent light output of the light emitting device from being reduced.

The embodiment may improve the reliability of the light emitting device package having the light emitting device and the light unit.

BEST MODE

Mode for Invention

In the description of the embodiments, it will be understood that, when a layer (or film), a region, a pattern, or a structure is referred to as being on or "under" another substrate, another layer (or film), another region, another pad, or another pattern, it can be "directly" or "indirectly"

over the other substrate, layer (or film), region, pad, or pattern, or one or more intervening layers may also be present. Such a position of the layer has been described with reference to the drawings.

Hereinafter, a light emitting device, a light emitting device package, and a method of manufacturing the light emitting device according to embodiments will be described in detail with reference to the accompanying drawings.

Figure 1:
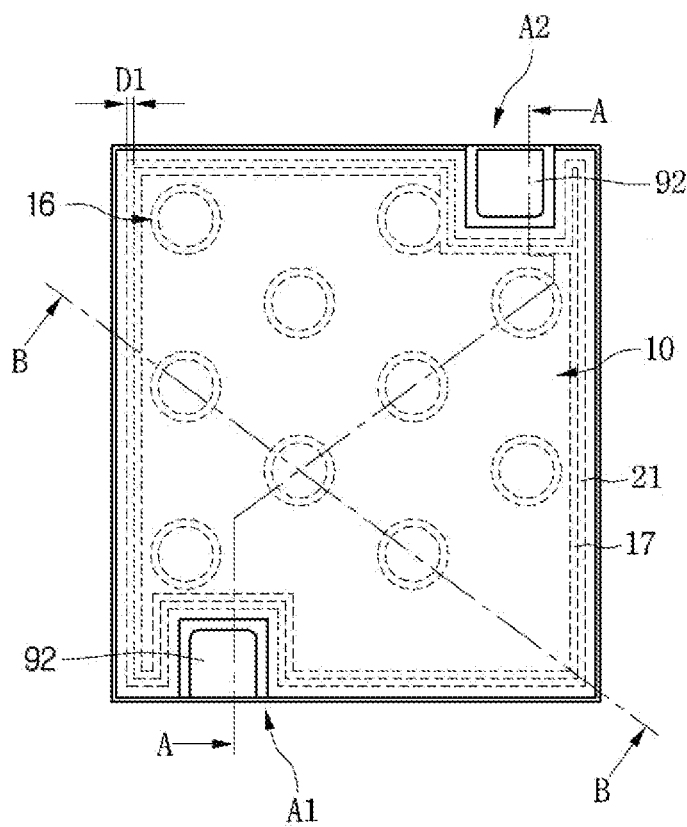
FIG. 1 is a plan view showing a light emitting device according to a first embodiment.
Figure 2:
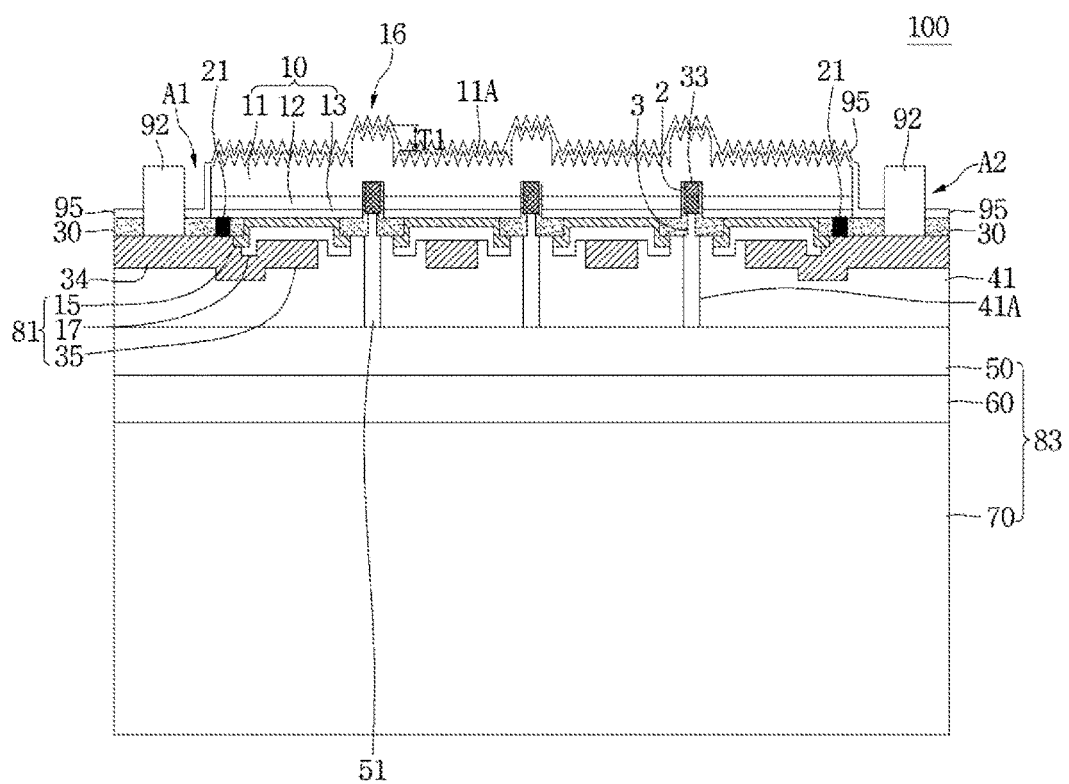
FIG. 2 is a cross-sectional view taken along line A-A of the light emitting device of FIG. 5.
Figure 3:
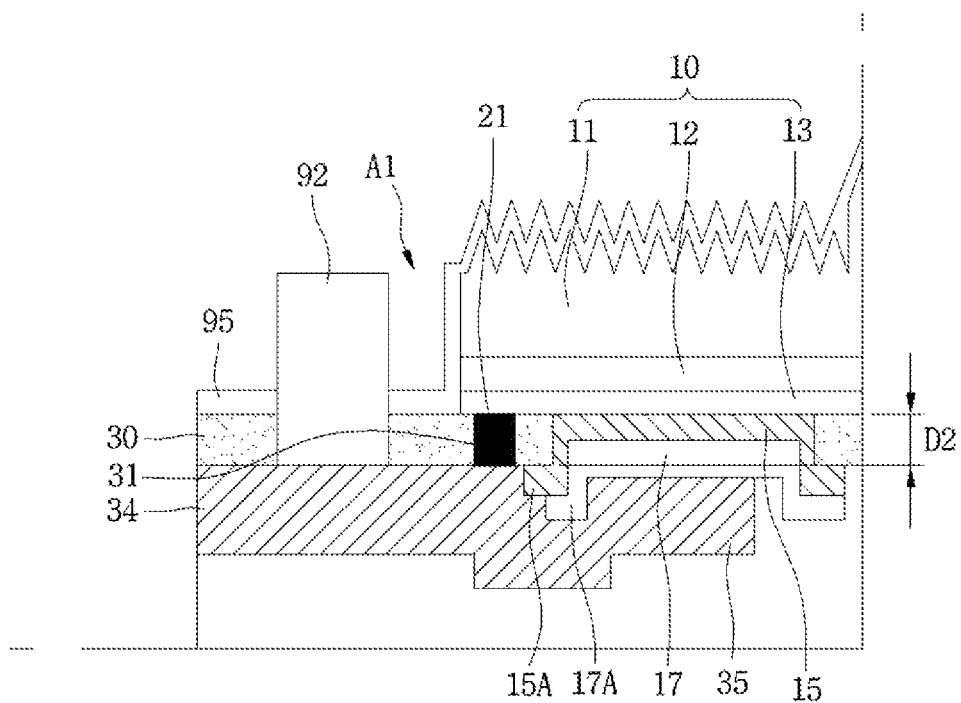
FIG. 3 is a partial enlarged view of the light emitting device of FIG. 2.
Figure 4:
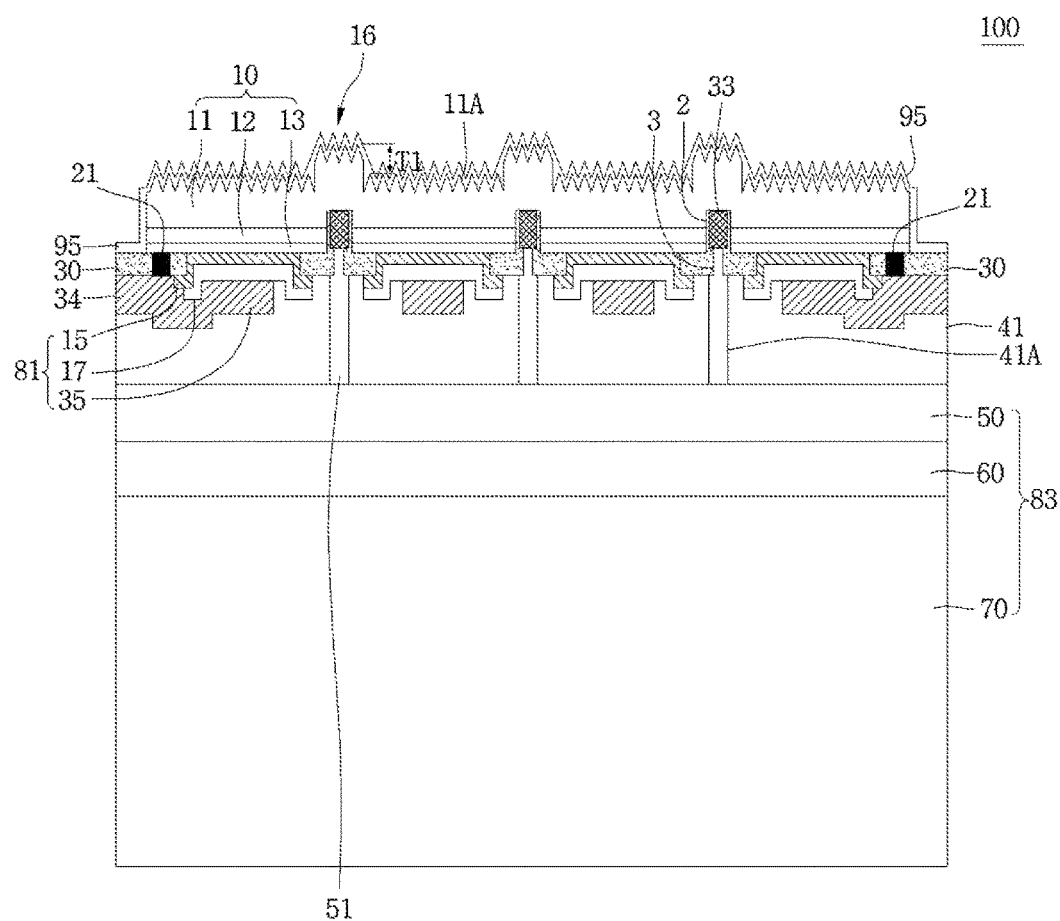
FIG. 4 is a cross-sectional view taken along line B-B of the light emitting device of FIG. 1.

FIG. 1 is a plan view showing a light emitting device according to a first embodiment. FIG. 2 is a cross-sectional view taken along line A-A of the light emitting device of FIG. 5. FIG. 3 is a partial enlarged view of the light emitting device of FIG. 2. FIG. 4 is a cross-sectional view taken along line B-B of the light emitting device of FIG. 1.

Referring to FIGS. 1 to 4, a light emitting device 100 includes a light emitting structure 10 having a plurality of semiconductor layers 11, 12, and 13, a barrier layer 21 disposed along a lower peripheral portion of the light emitting structure 10, and at least one electrode layer 81 or 83 under the light emitting structure 10. The at least one electrode layer 81 or 83 may include a reflective layer 17 and the barrier layer 21 may be disposed outside the reflective layer 17. The light emitting device 100 may include at least one pad 92 disposed above or outside of the light emitting structure 10.

The light emitting device 100 may emit at least one of ultraviolet light, blue light, green light, red light, or infrared light. The light emitting element 100 may include a semiconductor device, such as a light receiving device or a protective device.

The light emitting structure 10 may include a first semiconductor layer 11, an active layer 12, and a second semiconductor layer 13. The active layer 12 may be disposed between the first semiconductor layer 11 and the second semiconductor layer 13. The active layer 12 may be disposed under the first semiconductor layer 11 and the second semiconductor layer 13 may be disposed under the active layer 12.

The lateral side of the light emitting structure 10 may have a perpendicular surface, an inclined surface, or a stepped structure to the bottom surface of the light emitting structure 10, but the embodiment is not limited thereto. When the lateral side of the light emitting structure 10 is inclined, light extraction efficiency may be improved.

The first semiconductor layer 11 includes an n-type semiconductor layer doped with a first conductive dopant such as an n-type dopant. The second semiconductor layer 13 includes a p-type semiconductor layer doped with a second conductive dopant such as a p-type dopant. For another example, the first semiconductor layer 11 may include a p-type semiconductor layer, and the second semiconductor layer 13 may include an n-type semiconductor layer.

The first semiconductor layer 11 may be realized with a compound semiconductor. The first semiconductor layer 11 may be realized with at least one of a group II-VI compound semiconductor and a group III-V compound semiconductor. For example, the first semiconductor layer 11 may be realized with a semiconductor material having a compositional formula of $In_xAl_yGa_{1-x-y}N$ ($0 \leq x \leq 1$, $0 \leq y \leq 1$, $0 \leq x+y \leq 1$). For instance, the first semiconductor layer 11 may be selected from the group consisting of GaN, AlN, AlGaN, InGaN, InN, InAlGaN, AlInN, AlGaAs, GaP, GaAs, GaAsP, and AlGaInP, and may be doped with n type dopant such as Si, Ge, Sn, Se, or Te.

The first semiconductor layer 11 may is formed on the top surface thereof a rough concavo-convex part 11A, and the concavo-convex part 11A may improve the light extraction efficiency. The side end surface of the concavo-convex part 11A may include a polygonal shape or a hemispherical shape.

The active layer 12 may be disposed under the first semiconductor layer 11. The active layer 12 emits the light based on the bandgap difference of the energy band according to intrinsic material for the active layer 12 through the recombination of electrons (or holes) injected through the first semiconductor layer 11 and holes (or electrons) injected through the second semiconductor layer 13. The active layer 12 may have at least one of a single quantum well structure, a multiple quantum well (MQW) structure, a quantum dot structure, or a quantum wire structure, but the embodiment is not limited thereto.

The active layer 12 may be realized with a compound semiconductor. The active layer may be realized with at least one of a group II-VI compound semiconductor and a group III-V compound semiconductor. The active layer 12 may be realized with a semiconductor material having a compositional formula of $In_xAl_yGa_{1-x-y}N$ ($0 \leq x \leq 1$, $0 \leq y \leq 1$, $0 \leq x+y \leq 1$). When the active layer 12 is realized in the multi-well structure, the active layer 12 may be realized by stacking a plurality of well layers and a plurality of barrier layers. For example, the active layer may be realized at the cycle of an InGaN well layer/GaN barrier layer, an InGaN well layer/AlGaN barrier layer, an InAlGaN well layer/InAlGaN barrier layer, an AlGaN well layer/AlGaN barrier layer, or a GaN well layer/AlGaN barrier layer.

The second semiconductor layer 13 may be disposed under the active layer 12. The second semiconductor layer 13 may be realized with, for example, a p-type semiconductor layer. The second semiconductor layer 13 may be realized with a compound semiconductor. The second semiconductor layer 13 may be realized with at least one of a group II-VI compound semiconductor and a group III-V compound semiconductor.

The second semiconductor layer 13 may be realized with a semiconductor material having a compositional formula of $In_xAl_yGa_{1-x-y}N$ ($0 \leq x \leq 1$, $0 \leq y \leq 1$, $0 \leq x+y \leq 1$). The second semiconductor layer 13 may include, for example one of the group consisting of GaN, AlN, AlGaN, InGaN, InN, InAlGaN, AlInN, AlGaAs, GaP, GaAs, GaAsP, and AlGaInP and may be doped with a p-type dopant such as Mg, Zn, Ca, Sr, or Ba.

For another example, an n-type semiconductor layer having a conductive type different from that of the second semiconductor layer 13 may be further formed under the second semiconductor layer 13. Accordingly, the light emitting device 100 may include at least one of np, pn, npn, and pnp junction structures. In addition, the doping concentration of impurities in the first and second semiconductor layers 11 and 13 may be uniform or irregular. In other words, the light emitting structure 145 may be variously formed, and the embodiment is not limited thereto.

An AlGaN/GaN, InGaN/GaN or InGaN/InGaN superlattice structure obtained by alternately arranging mutually different semiconductor layers may be formed between the first semiconductor layer 11 and the active layer 12 or between the second semiconductor layer 13 and the active layer 12. In addition, an electron blocking layer doped with a second conductive dopant may be formed between the second semiconductor layer 13 and the active layer 12. For example, the electron blocking layer may include an AlGaN layer, but the embodiment is not limited thereto.

The first semiconductor layer 11 includes a protrusion part 16. A plurality of protrusion parts 16 may be spaced apart from each other. The protrusion part 16 may be formed on the top surface thereof with a rough concavo-convex part 11A, but the embodiment is not limited thereto. The protrusion part 16 may be a first conductive semiconductor layer or an undoped or unintentionally doped semiconductor layer, but the embodiment is not limited thereto. The projecting part 16 may not be formed, but the embodiment is not limited thereto.

The at least one electrode layer 81 or 83 may include at least one of a first electrode layer 81 and a second electrode layer 83 under the first electrode layer 81. The first embodiment will be described as an example in which the first and second electrode layers 81 and 83 are disposed under the light emitting structure 10 for convenience of explanation.

The first electrode layer 81 may be electrically connected with the second semiconductor layer 13 and the second electrode layer 83 may be electrically connected with the first semiconductor layer 11. At least one or both of the first and second electrode layers 81 and 83 may be disposed under the light emitting structure 10. The second electrode layer 83 may have a second contact layer 33 in the first semiconductor layer 11 and may be disposed under the light emitting structure 10. The at least one of the first and second electrode layers 81 and 83 may include a support member 70 to support the light emitting device 100. The support member 70 may have electrical conductivity. The support member 70 may be included in the configuration of any one of the electrode layers 81 and 83 or may be separately formed from the electrode layers 81 and 83, but the embodiment is not limited thereto.

The first electrode layer 81 is, for example, disposed between the light emitting structure 10 and the second electrode layer 83 and is electrically connected with the second semiconductor layer 13 of the light emitting structure 10. The first electrode layer 81 is electrically insulated from the second electrode layer 83. The first electrode layer 81 may include a first contact layer 15, a reflective layer 17, and a capping layer 35. The first electrode layer 81 may include a barrier layer 21. The first contact layer 15 is disposed between the reflective layer 17 and the second semiconductor layer 13 and the reflective layer 17 is disposed between the first contact layer 15 and the capping layer 35. The first contact layer 15, the reflective layer 17, and the capping layer 35 may be formed of mutually different conductive materials, but the embodiment is not limited thereto.

The first contact layer 15 may make contact with the second semiconductor layer 13 and, for example, may make ohmic contact with the second semiconductor layer 13. For example, the first contact layer 15 may be formed of a conductive oxide film, a conductive nitride, or metal. For example, the first contact layer 15 may include at least one selected from the group consisting of Indium Tin Oxide (ITO), ITO Nitride (ITON), Indium Zinc Oxide (IZO), IZO Nitride (IZON), Aluminum Zinc Oxide (AZO), Aluminum Gallium Zinc Oxide (AGZO), Indium Zinc Tin Oxide (IZTO), Indium Aluminum Zinc Oxide (IAZO), Indium Gallium Zinc Oxide (IGZO), Indium Gallium Tin Oxide (IGTO), Antimony Tin Oxide (ATO), Gallium Zinc Oxide (AZO), IZO Nitride (IZON), ZnO, IrOx, RuOx, NiO, In, Au, W, Al, Pt, Ag, and Ti. The first contact layer 15 may be formed in a single layer or a multi-layer.

The reflective layer 17 may be electrically connected with the first contact layer 15 and the capping layer 35. The reflective layer 17 may reflect incident light from the light emitting structure 10 to increase an amount of light to be extracted to the outside. The reflective layer 17 may be formed in a single layer or a multi-layer.

The reflective layer 17 may be formed of metal having a light reflectance of 70% or more. For example, the reflective layer 17 may be formed of metal including at least one of Ag, Ni, Al, Rh, Pd, Ir, Ru, Mg, Zn, Pt, Cu, Au, and Hf, or the alloy thereof. In addition, the reflective layer 17 may be formed of metal, the alloy thereof, or a transmissive conductive material, such as ITO, IZO, IZTO, IAZO, IGZO, IGTO, AZO, or ATO, in a single layer or a multi-layer. For example, according to the embodiment, the reflective layer 17 may include at least one of Ag, Al, an Ag—Pd—Cu alloy, and an Ag—Cu alloy. For example, the reflective layer 17 may include an Ag layer and a Ni layer alternately formed or may include a Ni/Ag/Ni layer, a Ti layer, and a Pt layer.

For another example, the first contact layer 15 may be formed under the reflective layer 17, and at least a portion of the first contact layer 15 may make contact with the second semiconductor layer 13 through the reflective layer 17. For another example, the reflective layer 17 may be disposed under the first contact layer 15, and a portion of the reflective layer 17 may contact the second semiconductor layer 13 through the first contact layer 15.

The reflective layer 17 may include a material, such as metal, that causes migration. The reflective layer 17 may include metal that causes migration by electrolyte ions.

The light emitting device 100 according to the embodiment may include the capping layer 35 under the reflective layer 17. The capping layer 35 may make contact with the bottom surface of the reflective layer 17. The capping layer 35 may include a contact part 34 partially provided at an outer portion thereof with a pad 92. The capping layer 35 may be a wiring layer to transmit power supplied from the pad 92, but the embodiment is not limited thereto. The capping layer 35 may include metal, for example, at least one of Au, Cu, Ni, Ti, Ti—W, Cr, W, Pt, V, Fe, and Mo and may be formed in a single layer or a multi-layer.

The contact part 34 of the capping layer 35 may be disposed in a region which does not overlap with the light emitting structure 10 in the vertical direction and may overlap with the pad 92 in the vertical direction. The contact part 34 of the capping layer 35 is disposed in a region which does not overlap with the first contact layer 15 and the reflective layer 17 in a vertical direction. The contact part 34 of the capping layer 35 is disposed lower than the light emitting structure 10 and may directly make contact with the pad 92.

The outer part of the capping layer 35 may be disposed further outward from the lateral of the light emitting structure 10. The outer portion of the capping layer 35 may be arranged to overlap with the outer portion of a protective layer 30 and the outer portion of a passivation layer 95 in the vertical direction.

The pad 92 may be formed in a single layer or a multi-layer, and may include at least one of Ti, Ag, Cu, and Au. For example, the pad 92 may include Au in the case of the single layer, and may be a stack structure of Ti/Ag/Cu/Au, or a Ti/Cu/Au in the case of the multi-layer. The pad 92 may directly make contact with at least one of the reflective layer 17 and the first contact layer 15, but the embodiment is not limited thereto.

At least one or a plurality of pads 92 may be disposed at an outer portion of the light emitting structure 10. The pad 92 may be disposed in regions A1 and A2 disposed between outer sidewall of the first electrode layer 81 and the light emitting structure 10. The pad 92 may make contact with the protective layer 30 and the passivation layer 95 at the lower peripheral portion thereof, but the embodiment is not limited thereto.

The protective layer 30 may be disposed on the bottom surface of the light emitting structure 10 and may make contact with the bottom surface of the second semiconductor layer 13 and the first contact layer 15 or the reflective layer 17.

The inner portion of the protective layer 30 which overlaps with the light emitting structure 10 in the vertical direction may be arranged to overlap with the region of the protrusion part 16 in the vertical direction. The outer portion of the protective layer 30 extends upwardly from the contact part 34 of the capping layer 35 and overlaps with the contact part 34 and the outer portion of the capping layer 35 in the vertical direction. The outer portions of the protective layer 30 may extend to the outer regions A1 and A2 from the sidewalls of the light emitting structure 10 to prevent moisture from infiltrating and to protect the chip from impact in the etching process. In addition, the protective layer 30 may serve as an etching stopper in an isolation process for an individual light emitting structure 10, and may prevent the electrical characteristics of the light emitting device from being degraded in the isolation process.

The protective layer 30 may serve as a channel layer, a lower-refractive layer, or an isolation layer. The protective layer 30 may be formed of an insulating material, for example, an oxide or a nitride. For example, the protective layer 30 may be formed of at least one selected from the group consisting of $SiO_2$, $Si_xO_y$, $Si_3N_4$, $Si_xN_y$, $SiO_xN_y$, $Al_2O_3$, $TiO_2$, and AlN. The protective layer 30 may be formed of a transparent material. The protective layer 30 may be formed in a single layer or in a multi-layer.

The light emitting device 100 according to the embodiment may include an insulating layer 41 under the first electrode layer 81 and on the second electrode layer 83. The insulating layer 41 is disposed between the first electrode layer 81 and the second electrode layer 83 to electrically insulate the first electrode layer 81 from the second electrode layer 83. The insulating layer 41 makes contact with the bottom surface of the first electrode layer 81 and the top surface of the second electrode layer 83. The thickness of the insulating layer 41 may be greater than the thickness of each of the protective layer 30, the capping layer 35, the first contact layer 15, and the reflective layer 17. The upper portion of the insulating layer 41 may make contact with the protective layer 30 and may be arranged to overlap with the protrusion part 16 in the vertical direction. The protrusion part 16 can be omitted.

The insulating layer 41 may be formed of, for example, an oxide or a nitride. For example, the insulating layer 41 may be formed of at least one selected from the group consisting of $SiO_2$, $Si_xO_y$, $Si_3N_4$, $Si_xN_y$, $SiO_xN_y$, $Al_2O_3$, $TiO_2$, and AlN.

As illustrated in FIGS. 2 to 4, the light emitting device 100 according to the embodiment may include the barrier layer 21. The barrier layer 21 may be disposed outside the reflective layer 17. The barrier layer 21 may be formed of metal. The barrier layer 21 may be disposed in a region, which does not overlap with the reflective layer 17 in the vertical direction, under of the light emitting structure 10. The barrier layer 21 may be disposed outside the first contact layer 15. The barrier layer 21 may be disposed in a region, which does not overlap with the first contact layer 15 in the vertical direction, under the light emitting structure 10.

As illustrated in FIG. 1, the barrier layer 21 may be disposed along an outer peripheral portion of the reflective layer 17. The barrier layer 21 may be disposed adjacent to the sidewall of the light emitting structure 10 and disposed along the bottom surface of the light emitting structure 10.

The barrier layer 21 may be a continuous loop shape, a ring shape, or a frame shape, but the embodiment is not limited thereto. The barrier layer 21 may prevent moisture from infiltrating from the outside. The barrier layer 21 may be disposed outside the reflective layer 17 to prevent migration of the reflective layer 17 or the material constituting the reflective layer 17. In this case, the migration direction of the material constituting the reflective layer 17 or the reflective layer 17 may be an outward direction of the light emitting structure 10 or a moisture permeation direction. Accordingly, the light emitting device having the barrier layer 21 may prevent reliability from being lowered due to moisture and prevent light output from being reduced.

As illustrated in FIGS. 2 to 4, the barrier layer 21 may be disposed between the reflective layer 17 and the protective layer 30. The barrier layer 21 may be disposed between the bottom surface of the light emitting structure 10 and the capping layer 35. The barrier layer 21 may make contact with the top surface of the capping layer 35 and the bottom surface of the second semiconductor layer 13 in a region which overlaps with the light emitting structure 10 in the vertical direction. Accordingly, the barrier layer 21 can prevent the reflective layer 17 from moving in the outward direction at the interfacial surface between the light emitting structure 10 and the capping layer 35.

As illustrated in FIG. 3, the barrier layer 21 may be disposed in a hole 31 disposed inside the protective layer 30. The thickness D2 of the barrier layer 21 may be equal to or thicker than that of the protective layer 30. When the thickness D2 of the barrier layer 21 is thinner than that of the protective layer 30, the contact area between the barrier layer 21 and the capping layer 35 is reduced by the protective layer 30 and thus the function of preventing the migration of the material constituting the reflective layer 17 or the reflective layer 17 may be deteriorated.

The width (D1 in FIG. 1) of the barrier layer 21 may be in the range of 2 µm or more, for example, 2.5 µm to 3.5 µm for the contact between the bottom surface of the light emitting structure 10 and the capping layer 35. When the width D1 of the barrier layer 21 is less than the value in the above range, the area between the bottom surface of the light emitting structure 10 and the top surface of the capping layer 35 is reduced, so that the effect of preventing the migration of the reflective layer 17 or the material constituting the reflective layer 17 may be degraded. When the width D1 of the barrier layer 21 is in excess of the above range, the reflection area may be reduced, or the optical loss may be increased.

The barrier layer 21 may be formed of a metal material different from those of the first contact layer 15 and the reflective layer 17. The barrier layer 21 may be formed of, for example, at least one of Ni, Ti, Pt, Au, W, and Al, or may be in a single layer or in a multi-layer. The barrier layer 21 may be formed of the same metal as that of the capping layer 35, but the embodiment is not limited thereto.

The barrier layer 21 may electrically connect the second semiconductor layer 13 and the capping layer 35. However, the embodiment is not limited thereto. The barrier layer 21 prevents the migration the material constituting the reflective layer 17 or the reflective layer 17, thereby blocking the leakage current from being caused by the migration of the reflective layer 17 or the migration of the material constituting the reflective layer 17.

Referring to FIG. 3, an outer region 17A of the reflective layer 17 is adjacent to the barrier layer 21 and may be located inside an outer region 15A of the first contact layer 15. Accordingly, the barrier layer 21 may increase the migration distance of the material constituting the reflective layer 17 or the reflective layer 17. The outer region 15A of the first contact layer 15 may extend further outward from the outer region 17A of the reflective layer 17, and the embodiment is not limited thereto.

The second electrode layer 83 includes an anti-diffusion layer 50 disposed under the insulating layer 41, a bonding layer 60 disposed under the anti-diffusion layer 50, and a support member 70 formed of a conductive material under the bonding layer 60.

The second electrode layer 83 may be electrically connected with the first semiconductor layer 11. The second electrode layer 83 selectively includes one or two of the anti-diffusion layer 50, the bonding layer 60, and the support member 70, and at least one of the anti-diffusion layer 50 or the bonding layer 60 may not be formed. The support member 70 may be formed separately from the second electrode layer 83, but the embodiment is not limited thereto.

The anti-diffusion layer 50 may include at least one of Cu, Ni, Ti, Ti—W, Cr, W, Pt, V, Fe, and Mo and may be formed in a single layer or in a multi-layer. The anti-diffusion layer 50 may function as a diffusion barrier layer between the insulating layer 41 and the bonding layer 60. The anti-diffusion layer 50 may be electrically connected with the bonding layer 60 and the conductive support member 70 and may be electrically connected with the first semiconductor layer 11.

The anti-diffusion layer 50 may prevent a material contained in the bonding layer 60 from being diffused toward the reflective layer 17 in the process of providing the bonding layer 60. For example, the anti-diffusion layer 50 may prevent a substance such as tin (Sn) contained in the bonding layer 60 from affecting the reflective layer 17.

The bonding layer 60 may include barrier metal or bonding metal. For example, the bonding layer 60 may include at least one of Ti, Au, Sn, Ni, Cr, Ga, In, Bi, Cu, Ag, Nb, Pd or Ta and may be formed in a single layer or a multi-layer. The support member 70 supports the light emitting structure 10 according to the embodiment and may perform a heat radiation function. The bonding layer 60 may include a seed layer.

The support member 70 may be formed of at least one of metal or a carrier substrate, such as a semiconductor substrate (for example, Si, Ge, GaN, GaAs, ZnO, SiC, and SiGe) doped with Ti, Cr, Ni, Al, Pt, Au, W, Cu, Mo, Cu—W, or impurities.

A second contact layer 33 is disposed inside the first semiconductor layer 11 and makes contact with the first semiconductor layer 11. The top surface of the second contact layer 33 may be disposed above the bottom surface of the first semiconductor layer 11 and may be electrically connected with the first semiconductor layer 11 and insulating from the active layer 12 and the second semiconductor layer 13.

The second contact layer 33 may be electrically connected with the second electrode layer 83. The second contact layer 33 may be disposed through the active layer 12 and the second semiconductor layer 13. The second contact layer 33 is disposed in a recess 2 disposed in the light emitting structure 10 and is insulated from the active layer 12 and the second semiconductor layer 13 by the protective layer 30. A plurality of the second contact layers 33 may be spaced apart from each other to spread a current inside the first semiconductor layer 11. Each of the protrusions 16 may overlap with the second contact layer 33 in the vertical direction to protect the upper region of the recess 2.

The second contact layer 33 may be connected with a protrusion 51 of the second electrode layer 83 and the protrusion 51 may protrude from the anti-diffusion layer 50 or be formed separately. The protrusion 51 passes through a hole 41A provided in the insulating layer 41 and the protective layer 30, may be insulated from the first electrode layer 81, and may be formed in a single layer or a multi-layer. The recess structure for the protrusion 51 in the light emitting structure 10 may be removed when an electrode is disposed on the first semiconductor layer 11, but the embodiment is not limited thereto.

The second contact layer 33 may include at least one of Cr, V, W, Ti, Zn, Ni, Cu, Al, Au and Mo and may be formed in a single layer or in a multi-layer. The protrusion 51 may include at least one of materials constituting the anti-diffusion layer 50 and the bonding layer 60, but the embodiment is not limited thereto. For example, the protrusion 51 may include at least one of Ti, Au, Sn, Ni, Cr, Ga, In, Bi, Cu, Ag, Nb, Pd, or Ta. The second electrode layer 83 may include the second contact layer 33 and the protrusion 51 connected with the second contact layer 33, and the embodiment is not limited thereto.

The pad 92 is electrically connected with the first electrode layer 81 and may be exposed to regions A1 and A2 outside the sidewalls of the light emitting structure 10. One or a plurality of pads 92 may be arranged, and the pads 92 may be spaced apart from each other as illustrated in FIG. 1. The pad 92 may include at least one of Cu, Ni, Ti, Ti—W, Cr, W, Pt, V, Fe, and Mo and may be formed of in a single layer or in a multi-layer.

The passivation layer 95 may protect the surface of the light emitting structure 10, may insulate the pad 92 from the light emitting structure 10, and may make contact with the peripheral portion of the protective layer 30. The passivation layer 95 may have a refractive index lower than the material of the semiconductor layer constituting the light emitting structure 10 and may improve the light extraction efficiency. The passivation layer 95 may be implemented with, for example, an oxide or a nitride. For example, the passivation layer 95 may be formed of at least one selected from the group consisting of $SiO_2$, $Si_xO_y$, $Si_3N_4$, $Si_xN_y$, $SiO_xN_y$, $Al_2O_3$, $TiO_2$, and AlN. Meanwhile, the passivation layer 95 may be omitted according to design.

According to the embodiment, the light emitting structure 10 may be driven by the first electrode layer 81 and the second electrode layer 83. In other words, the light emitting device according to the embodiment may include a plurality of light emitting structures that may be individually driven in one device. Although the embodiment has been described while focusing on the case that two light emitting structures are disposed in one light emitting device, three or four or more light emitting structures may be disposed in one light emitting device, and may be individually driven. The light emitting device having such a structure can be usefully applied to a lighting device of a vehicle, such as a headlight or a tail lamp, by an example.

In the light emitting device according to the embodiment, a phosphor layer (not illustrated) may be provided on the light emitting structure 10, and the phosphor layer may be formed to have a uniform thickness through, for example, a conformal coating, and the embodiment is not limited thereto.

In addition, according to an embodiment, an optical lens may be provided on the light emitting device and the embodiment is not limited thereto.

Figure 5:
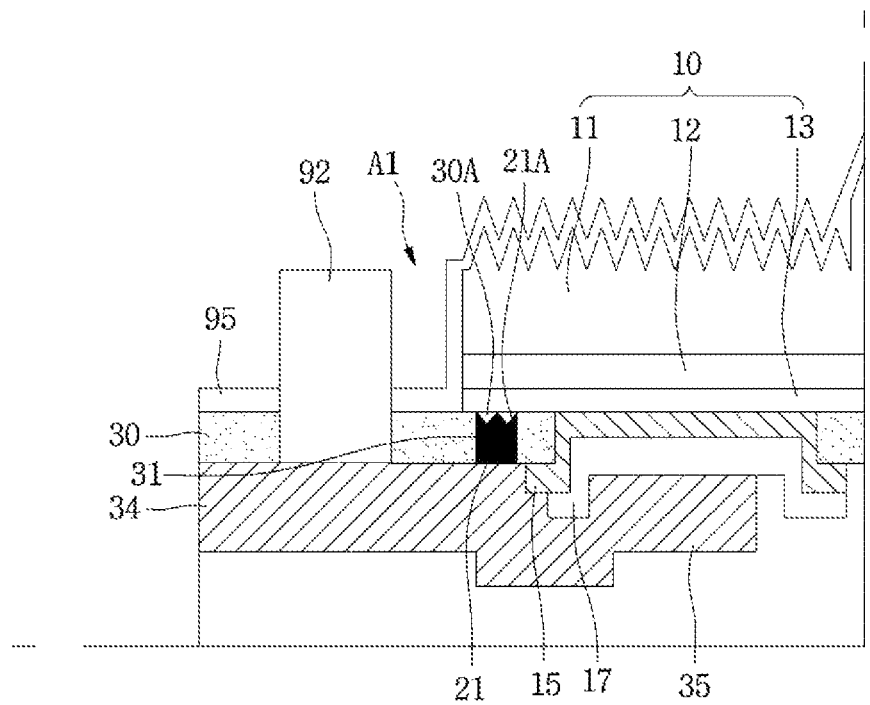
FIG. 5 is another example of a barrier layer of the light emitting device of FIG. 2.

FIG. 5 is another example of the barrier layer of the light emitting device illustrated in FIG. 3. In the following description with reference to FIG. 5, the same parts as those in the above-described configuration will be understood by making reference to the above-description.

Referring to FIG. 5, the barrier layer 21 may include a concavo-convex structure 21A formed on the top surface thereof. The convex part of the concavo-convex structure 21A may have a section surface formed in a polygonal such as a triangular or quadrilateral shape, in a hemispherical shape. The convex part of the concavo-convex structure 21A may make contact with the bottom surface of the light emitting structure 10, for example, the bottom surface of the second semiconductor layer 13. The part 30A of the protective layer 30 may be disposed on the concavo-convex structure 21, but the embodiment is not limited thereto.

The bottom surface of the barrier layer 21 may make contact with the top surface of the capping layer 35. The barrier layer 21 may prevent the migration of the material constituting the reflective layer 17 or the reflective layer 17. Accordingly, the light emitting device having the barrier layer 21 may provide an LED chip strong to moisture absorption, and may prevent the migration of the material constituting the reflective layer 17 or the reflective layer 17 to block the leakage current, thereby preventing reliability from being degraded due to moisture penetration.

Figure 6:
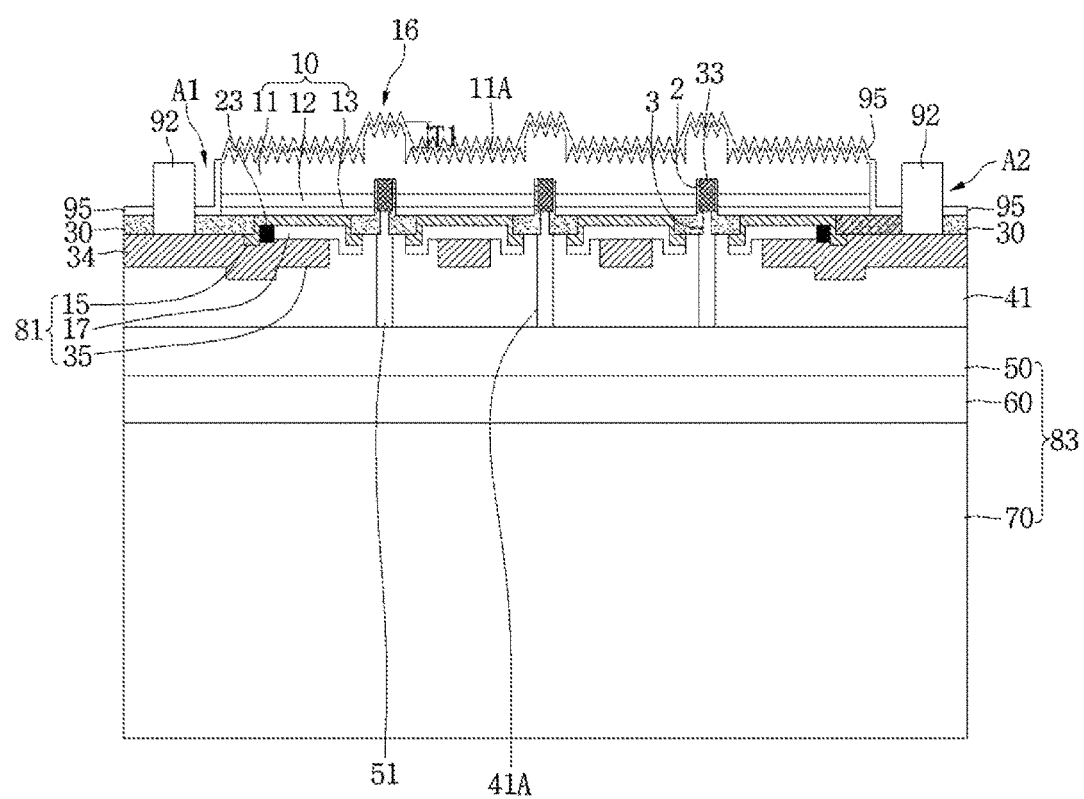
FIG. 6 is a side sectional view showing a light emitting device according to a second embodiment.
Figure 7:
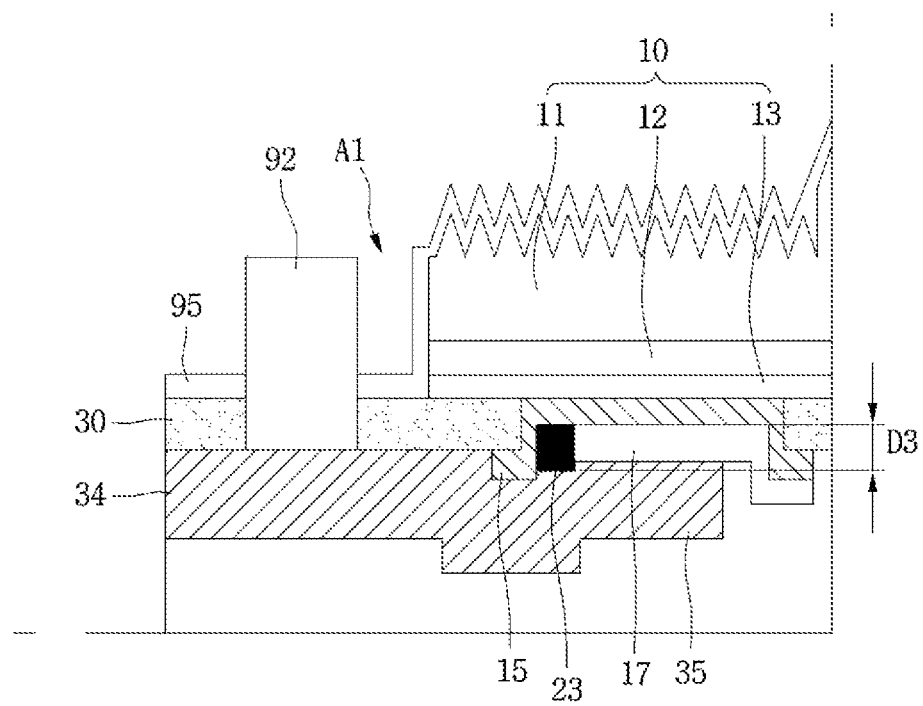
FIG. 7 is a partial enlarged view of the light emitting device of FIG. 6.

FIG. 6 is a side sectional view illustrating a light emitting device according to a second embodiment, and FIG. 7 is a partial enlarged view of FIG. 6. In the following description of the second embodiment, the same parts as those of the first embodiment will be understood by making reference to the description of the first embodiment.

Referring to FIGS. 6 and 7, a light emitting device includes a light emitting structure 10 having a plurality of semiconductor layers 11, 12, and 13, a barrier layer 23 under the light emitting structure 10, a first electrode layer 81 provided under the light emitting structure 10 and having a reflective layer 17 provided inside the barrier layer 23, a second electrode layer 83 under the first electrode layer 81, an insulating layer 41 between the first and second electrode layers 81 and 83, and a pad 92.

The light emitting structure 10 may include a first semiconductor layer 11, an active layer 12, and a second semiconductor layer 13. The active layer 12 may be disposed between the first semiconductor layer 11 and the second semiconductor layer 13. The active layer 12 may be disposed under the first semiconductor layer 11 and the second semiconductor layer 13 may be disposed under the active layer 12.

The first electrode layer 81 may be electrically connected with the second semiconductor layer 13 and the second electrode layer 83 may be electrically connected with the first semiconductor layer 11. At least one or both of the first and second electrode layers 81 and 83 may be disposed under the light emitting structure 10. The second electrode layer 83 having a second contact layer 33 disposed in the first semiconductor layer 11 may be disposed under the light emitting structure 10. Any one of the first and second electrode layers 81 and 83 may include a support member 70 to support the light emitting device, and the support member 70 may be a support member having the electrical conductivity. The support member 70 may be included in the configuration of any one of the electrode layers 81 and 83 or may be separately configured, but the embodiment is not limited thereto.

For example, the first electrode layer 81 is disposed between the light emitting structure 10 and the second electrode layer 83, is electrically connected with the second semiconductor layer 13 of the light emitting structure 10, and is electrically insulated from the second electrode layer 83. The first electrode layer 81 may include a first contact layer 15, a reflective layer 17, and a capping layer 35. The first electrode layer 81 may include a barrier layer 23. The first contact layer 15 is disposed between the reflective layer 17 and the second semiconductor layer 13 and the reflective layer 17 is disposed between the first contact layer 15 and the capping layer 35.

The first contact layer 15, the reflective layer 17, and the capping layer 35 may be formed of mutually different conductive materials, but the embodiment is not limited thereto. The reflective layer 17 may be formed of metal different from those of the capping layer 35 and the barrier layer 23.

The reflective layer 17 may be electrically connected with the first contact layer 15 and the capping layer 35. The reflective layer 17 may reflect light incident from the light emitting structure 10 to increase an amount of light to be extracted to the outside.

The reflective layer 17 may be formed of a metal having a light reflectance of 70% or more. For example, the reflective layer 17 may be formed of metal or an alloy containing at least one of Ag, Ni, Al, Rh, Pd, Ir, Ru, Mg, Zn, Pt, Cu, Au, and Hf. The reflective layer 17 may be formed in a multi-layer by using metal or the alloy thereof and a transmissive conductive material of ITO, IZO, IZTO, IAZO, IGZO, IGTO, AZO, or ATO. For example, according to an embodiment, the reflective layer 17 may include at least one of Ag, Al, an Ag—Pd—Cu alloy, or an Ag—Cu alloy. For example, the reflective layer 17 may include an Ag layer and a Ni layer formed alternately or may include a Ni/Ag/Ni layer, a Ti layer, or a Pt layer. For another example, the first contact layer 15 may be formed under the reflective layer 17, and at least a portion of the first contact layer 15 may make contact with the second semiconductor layer 13 through the reflective layer 17. For another example, the reflective layer 17 may be disposed under the first contact layer 15, and a portion of the first reflective layer 17 may make contact the second semiconductor layer 13 through the first contact layer 15.

The reflective layer 17 may include a material that causes migration, for example, metal. The reflective layer 17 may be metal that causes migration by electrolyte ions.

According to the embodiment, the light emitting device may include a capping layer 35 under the reflective layer 17. The capping layer 35 may make contact with the bottom surface of the reflective layer 17. The capping layer 35 may include a contact part 34 partially provided at an outer portion thereof with a pad 92. The capping layer 35 may be a wiring layer for transmitting power supplied from the pad 92, but the embodiment is not limited thereto.

The protective layer 30 may be disposed on the bottom surface of the light emitting structure 10 and may make contact with the bottom surface of the second semiconductor layer 13, or may make contact with the reflective layer 17.

The inner portion of the protective layer 30 which overlaps with the light emitting structure 10 in the vertical direction may be arranged to overlap with the region of the protrusion part 16 in the vertical direction. The outer portion of the protective layer 30 extends upward from the contact portion 34 of the capping layer 35 and overlaps with the contact part 34 and the outer portion of the capping layer 35 in the vertical direction.

The light emitting device according to the embodiment may include an insulating layer 41 under the first electrode layer 81 and on the second electrode layer 83. The insulating layer 41 is disposed between the first electrode layer 81 and the second electrode layer 83 to electrically insulate the first electrode layer 81 from the second electrode layer 83. The insulating layer 41 may make contact with the bottom surface of the first electrode layer 81 and the top surface of the second electrode layer 83. The upper portion of the insulating layer 41 may make contact with the protective layer 30 and may be arranged to overlap with the protrusion part 16 in the vertical direction.

The barrier layer 23 may be disposed outside the reflective layer 17. The barrier layer 23 may be disposed in a region, which does not overlap with the reflective layer 17 in the vertical direction, under the light emitting structure 10. The barrier layer 23 may be disposed under the first contact layer 15. The barrier layer 23 may be disposed in a region, which overlaps with the first contact layer 15 in the vertical direction, under the light emitting structure 10.

The barrier layer 23 may be disposed along the outer peripheral portion of the reflective layer 17. The barrier layer 23 may be disposed adjacent to the sidewall of the light emitting structure 10 rather than the reflective layer 17 and may be disposed around the lateral side of the light emitting structure 10. The barrier layer 23 may be a continuous loop shape, a ring shape, or a frame shape, but the embodiment is not limited thereto. The barrier layer 23 may prevent moisture from infiltrating from the outside. The barrier layer 23 may be disposed outside the reflective layer 17 to prevent the migration of the material constituting the reflective layer 17 or the reflective layer 17. The direction of migration of the material constituting the reflective layer 17 or the reflective layer 17 may be an outward direction of the light emitting structure 10 or a moisture permeation direction. Accordingly, the light emitting device having the barrier layer 23 may prevent reliability from being lowered due to moisture, and may prevent a light output from being reduced.

The barrier layer 23 may be disposed between the first contact layer 15 and the capping layer 35. The barrier layer 23 may make contact with the top surface of the capping layer 35 and the bottom surface of the first contact layer 15 in a region which overlaps with the light emitting structure 10 in the vertical direction. Accordingly, the barrier layer 23 may prevent the migration of the reflective layer 17 or the material constituting the reflective layer 17 from occurring outwardly at the interfacial surface between the first contact layer 15 and the capping layer 35.

The thickness D3 of the barrier layer 23 may be thicker than that of the first contact layer 15 and the reflective layer 17. When the thickness D3 of the barrier layer 23 is thinner than that of the reflective layer 17, the contact area between the barrier layer 23 and the capping layer 35 is reduced and thus the function of preventing the migration of the material constituting the reflective layer 17 or the reflective layer 17 may be deteriorated.

The width of the barrier layer 23 may be in the range of 2 μm or more, for example, 2.5 μm to 3.5 μm. When the width of the barrier layer 23 is smaller than the above range, the contact area with the capping layer 35 is reduced, and the effect of preventing the migration of the material constituting the reflective layer 17 or the reflective layer 17 may be lowered. When the width of the barrier layer 23 is in excess of the above range, the reflective area may be reduced, or the optical loss may be increased.

The barrier layer 23 may be formed of a material different from that of the first contact layer 15 and the reflective layer 17, may be at least one of Ni, Ti, Pt, Au, W, and Al, or the alloy thereof, and may be formed in a single layer or a multi-layer. When the barrier layer 23 is formed of, for example, Au or Al, the migration of the material constituting the reflective layer 17 or the reflective layer 17 may be blocked, moisture may be blocked, and reflectance may be prevented from being degraded. The barrier layer 23 may include metal having a reflectance lower than that of the reflective layer 17. The barrier layer 23 may be of the same metal as that of the capping layer 35, but the embodiment is not limited thereto.

The barrier layer 22 may electrically connect the first contact layer 15 and the capping layer 35, but the embodiment is not limited thereto. The migration of the material constituting the reflective layer 17 or the reflective layer 17 may be prevented by the barrier layer 23, thereby blocking the leakage current caused by the migration of the material constituting the reflective layer 17 or the reflective layer 17.

The second electrode layer 83 includes an anti-barrier layer 50 disposed under the insulating layer 41, a bonding layer 60 disposed under the anti-barrier layer 50, and a support member 70 disposed under the bonding layer 60 and formed of a conductive material. The second electrode layer 83 may be electrically connected with the first semiconductor layer 11. The second electrode layer 83 selectively includes one or two of the anti-diffusion layer 50, the bonding layer 60, and the support member 70, and at least one of the anti-diffusion layer 50 or the bonding layer 60 may not be formed. The support member 70 may be formed separately from the second electrode layer 83, but the embodiment is not limited thereto.

The anti-barrier layer 50 may serve as a diffusion barrier layer between the insulating layer 41 and the bonding layer 60. The anti-barrier layer 50 may be electrically connected with the bonding layer 60 and the conductive support member 70 and may be electrically connected with the first semiconductor layer 11.

The support member 70 may support the light emitting structure 10 according to the embodiment and may perform a heat radiation function.

Meanwhile, the second contact layer 33 is disposed in the first semiconductor layer 11, electrically connected with the first semiconductor layer 11, and insulated from the active layer 12 and the second semiconductor layer 13. The second contact layer 33 may be electrically connected with the second electrode layer 83. The second electrode layer 83 may include the second contact layer 33 and a protrusion 51 connected thereto. However, the embodiment is not limited thereto.

A passivation layer 95 may protect the surface of the light emitting structure 10, insulate the pad 91 from the light emitting structure 10, and make contact with the peripheral portion of a protective layer 30. The passivation layer 95 may have a refractive index lower than that of the material of the semiconductor layer constituting the light emitting structure 10 to improve the light extraction efficiency.

Figure 8:
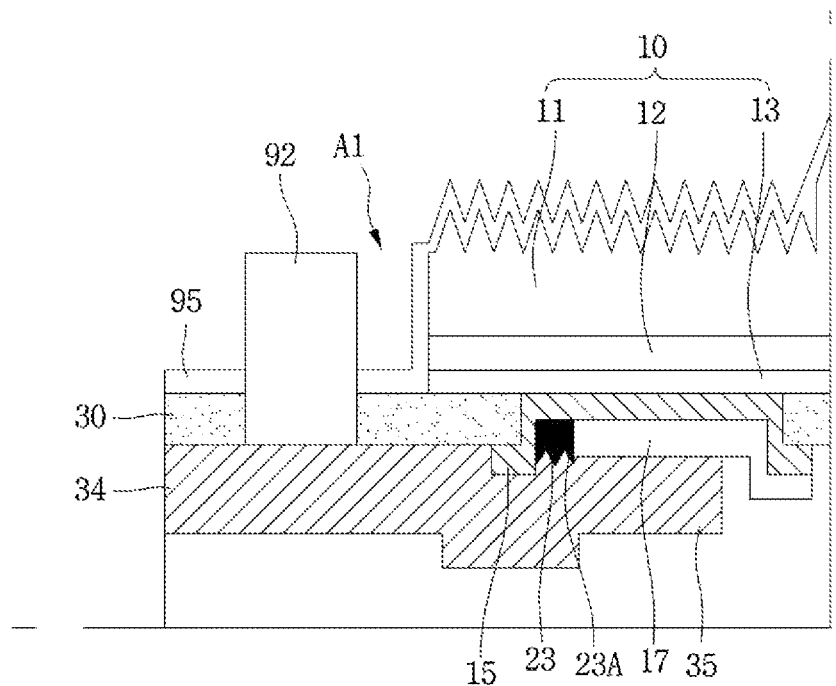
FIG. 8 is a view showing another example of the barrier layer of the light emitting device of FIG. 7.

FIG. 8 is another example of the barrier layer in the light emitting device of FIG. 7.

Referring to FIG. 8, the barrier layer 23 is disposed between the first contact layer 15 and the capping layer 35 and may include a concavo-convex structure on at least one of the top surface and the bottom surface of the barrier layer 23.

The barrier layer 23 may include a concavo-convex structure 23A on the bottom surface thereof, and an upper portion of the capping layer 35 may be coupled to the concavo-convex structure 23A. Accordingly, the interface movement distance between the barrier layer 23 and the capping layer 35 can be lengthened by the concavo-convex structure 23A.

The migration of the material constituting the reflective layer 17 or the reflective layer 17 may be prevented by the concave-convex structure 23A of the barrier layer 23. For example, the concavo-convex structure 23A on the bottom surface of the barrier layer 23 may effectively prevent the material constituting the reflective layer 17 or the reflective layer 17 from migrating through the gap between the bottom surface of the barrier layer 23 and the top surface of the capping layer 35.

Figure 9:
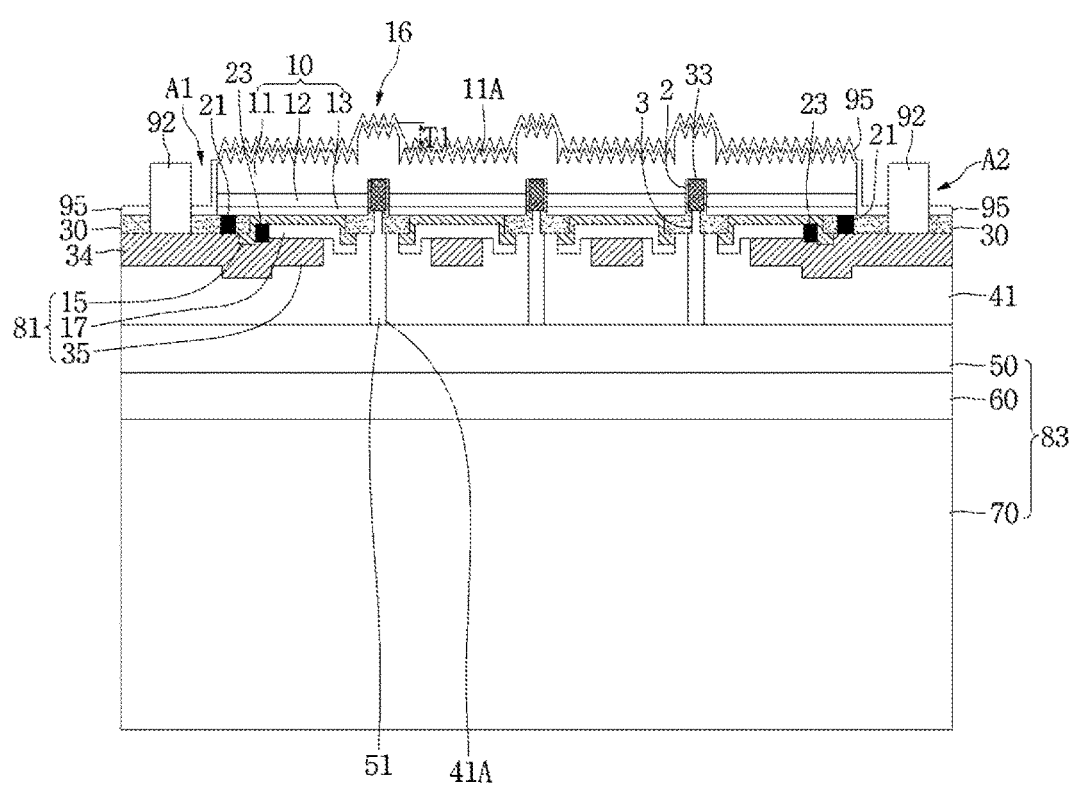
FIG. 9 is a side sectional view showing a light emitting device according to a third embodiment.

FIG. 9 is a side sectional view showing a light emitting device according to a third embodiment. In the following description of the third embodiment, the same configurations as those of the first and second embodiments will be understood by making reference to the description of the first and second embodiments.

Referring to FIG. 9, the light emitting device includes a light emitting structure 10 having a plurality of semiconductor layers 11, 12, and 13, barrier layers 21 and 23 under the light emitting structure 10, a first electrode layer 81 having a reflective layer 17 disposed under the light emitting structure 10 and disposed inward from the barrier layers 21 and 23, a second electrode layer 83 under the first electrode layer 81, and an insulating layer 41 disposed between the first and second electrode layers 81 and 83, and a pad 92.

The barrier layers 21 and 23 may be disposed at mutually different positions under the light emitting structure 10. The barrier layers 21 and 23 may include a plurality of layers, for example, a first barrier layer 21 and a second barrier layer 23. The first barrier layer 21 is the same as the barrier layer illustrated in FIG. 2, and the reference numeral is assigned and the details of the first barrier layer 21 will be understood by making reference to the description of the first embodiment. The second barrier layer 23 is the same as the barrier layer illustrated in FIG. 6 and will be described with the same reference numerals, and the details of the first barrier layer 21 will be understood by making reference to the description of the second embodiment.

The first and second barrier layers 21 and 23 may be disposed along the outer peripheral portion of the reflective layer 17. The first barrier layer 21 may be disposed adjacent to the sidewall of the light emitting structure 10 and disposed around the sidewall of the light emitting structure 10. The first barrier layer 21 may have a continuous loop shape, ring shape, or frame shape, but the embodiment is not limited thereto.

The second barrier layer 23 may be disposed outside the reflective layer 17. The second barrier layer 23 may be disposed in a region, which does not overlap the reflective layer 17 in the vertical direction, under the light emitting structure 10. The second barrier layer 23 may be disposed under the first contact layer 15. The second barrier layer 23 may be disposed in a region, which overlaps with the first contact layer 15 in a vertical direction, under the light emitting structure 10.

The first and second barrier layers 21 and 23 may be spaced apart from each other and a portion of the first contact layer 15 may be disposed between the first and second barrier layers 21 and 23.

The first and second barrier layers 21 and 23 may prevent moisture from infiltrating from the outside. The first and second barrier layers 21 and 23 may be disposed outside the reflective layer 17 to prevent migration of the reflective layer 17 or the material constituting the reflective layer 17. Accordingly, the light emitting device having the barrier layers 21 and 23 may prevent reliability from being lowered due to moisture, and may prevent a light output from being reduced.

Figure 10:
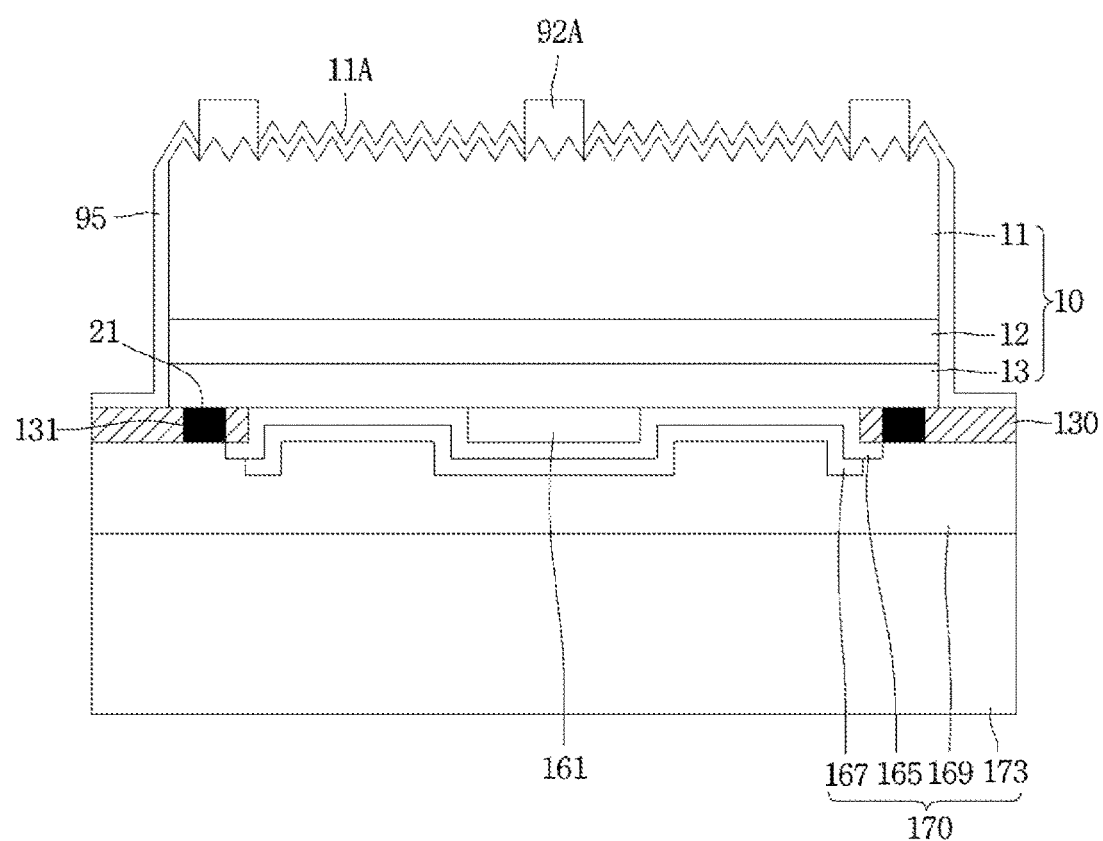
FIG. 10 is a side sectional view showing a light emitting device according to a fourth embodiment.

FIG. 10 is a view illustrating a light emitting device according to a fourth embodiment. In the following description of the fourth embodiment, the same configurations as those of the first and second embodiments will be understood by making reference to the description of the first and second embodiments.

Referring to FIG. 10, the light emitting device includes a light emitting structure 10 having a plurality of semiconductor layers 11, 12, and 13, a barrier layer 21 under the light emitting structure 10, a first electrode layer 170 having a reflective layer 167 disposed under the barrier layer 21 and disposed inward from the barrier layer 21, and a second electrode layer 92A on the light emitting structure 10.

The second electrode layer 92A is electrically connected with the first semiconductor layer 11 of the light emitting structure 10 and may be disposed on the top surface of the first semiconductor layer 11. The second electrode layer 92A may include a pad or an arm electrode or a bridge electrode branching from the pad, but the present disclosure is not limited thereto.

The first electrode layer 170 may include a first contact layer 165, a reflective layer 167, and a capping layer 169. The first electrode layer 170 may include the barrier layer 21. The first contact layer 165 is disposed between the reflective layer 167 and the second semiconductor layer 13 and the reflective layer 167 is disposed between the first contact layer 165 and the capping layer 169.

A passivation layer 95 may be formed on the surface of the light emitting structure 10 and a portion of the passivation layer 95 may be disposed on a protective layer 130.

The protective layer 130 may be disposed at an outer peripheral portion of the bottom surface of the light emitting structure 10 and may be disposed between the capping layer 169 of the first electrode layer 170 and the bottom surface of the light emitting structure 10. The outer portion of the protective layer 130 may be disposed outside the sidewall of the light emitting structure 10. The material of the protective layer 130 may be the same as the material of the protective layer disclosed in the first embodiment.

The protective layer 130 includes a hole 131 formed therein. The barrier layer 21 may be disposed in the hole 131. The barrier layer 21 may be disposed between the light emitting structure 10 and the capping layer 169. The barrier layer 21 may make contact with the bottom surface of the second semiconductor layer 13 and the top surface of the capping layer 169.

The barrier layer 21 may be disposed outside the reflective layer 167. The barrier layer 21 may be disposed in a region, which does not overlap the reflective layer 167 in the vertical direction, under the light emitting structure 10. The barrier layer 21 may be disposed outside the first contact layer 165. The barrier layer 21 may be disposed in a region, which does not overlap the first contact layer 165 in the vertical direction, under the light emitting structure 10.

The barrier layer 21 may be disposed adjacent to the sidewall of the light emitting structure 10 along the outer peripheral portion of the reflective layer 167. The barrier layer 21 may be a continuous loop shape, ring shape, or frame shape, but the embodiment is not limited thereto. The barrier layer 21 may prevent moisture from infiltrating from the outside. The barrier layer 21 may be disposed outside the reflective layer 167 to prevent migration of the reflective layer 167 or the material constituting the reflective layer 167. In this case, the migration direction of the reflective layer 167 may be the outward direction of the light emitting structure 10 or the moisture infiltration direction. Accordingly, the light emitting device having the barrier layer 21 may prevent reliability from being lowered due to moisture and prevent a light output from being reduced.

The barrier layer 21 may be formed of a material different from the first contact layer 165 and the reflective layer 167 and may be at least one of Ni, Ti, Pt, Au, W, Al, or the alloy thereof. The barrier layer 21 may be formed in a single layer or a multi-layer. The barrier layer 21 may include the same metal as the capping layer 169, but the embodiment is not limited thereto.

The barrier layer 21 may electrically connect the second semiconductor layer 13 with the capping layer 169, but the embodiment is not limited thereto. The migration of the reflective layer 167 or the material constituting the reflective layer 17 are prevented by the barrier layer 21, thereby preventing the leakage current caused by the migration of the reflective layer 17 or the material constituting the reflective layer 167.

The first contact layer 165, the reflective layer 167 and the capping layer 169 of the second electrode layer 170 will be understood by making reference to the description of the embodiment(s) disclosed above. The second electrode layer 170 may include a support member 173. The support member 173, which serves as a conductive member, may make contact with or may be electrically connected with a lower portion of the capping layer 169. The support member 70 may be formed of at least one of metal or a carrier substrate, such as a semiconductor substrate (for example, Si, Ge, GaN, GaAs, ZnO, SiC, and SiGe) doped with Ti, Cr, Ni, Al, Pt, Au, W, Cu, Mo, Cu—W, or impurities. The second electrode layer 170 may include at least one or both of an anti-diffusion layer and a bonding layer disclosed in the embodiment and disposed between the capping layer 169 and the support member 173, but the embodiment is not limited thereto.

A current blocking layer 161 may be disposed between the first contact layer 165 and the bottom surface of the light emitting structure 10, for example, the bottom surface of the second semiconductor layer 13. The current blocking layer 161 may overlap with a region for a second electrode layer 92A in the vertical direction. The current blocking layer 161 may block the current supplied to the first electrode layer 170 to diffuse the current.

The current blocking layer 161 may be formed of an insulating material or the same material as that of the protective layer 130, but the embodiment is not limited thereto. The current blocking layer 161 may be a metallic material, but the embodiment is not limited thereto.

Figure 11:
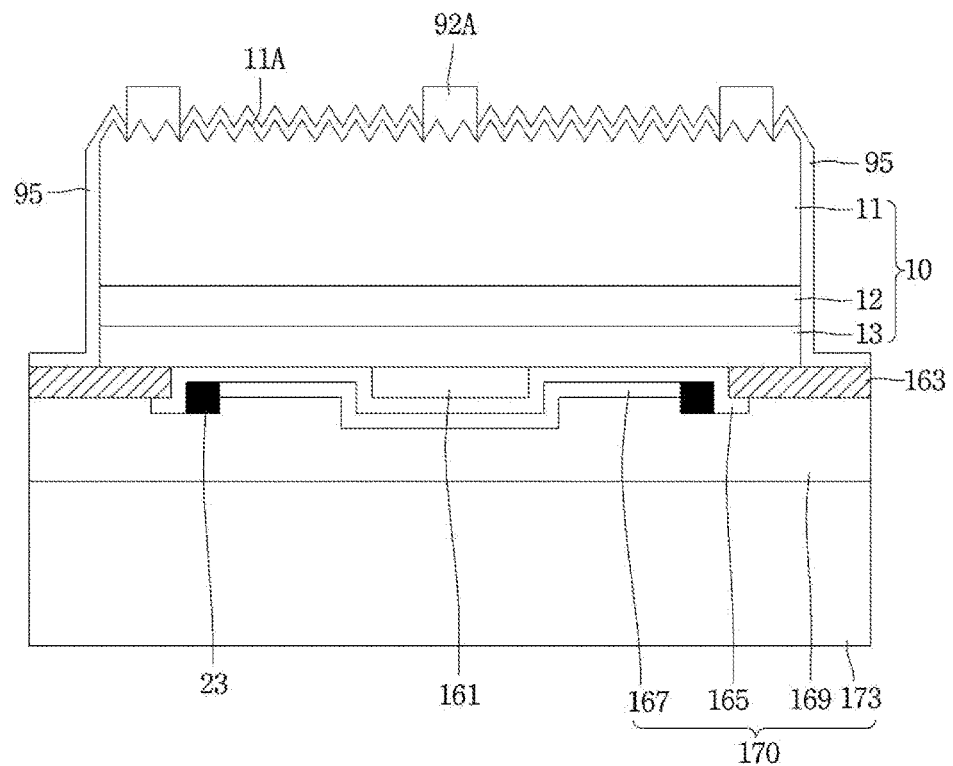
FIG. 11 is a side sectional view showing a light emitting device according to a fifth embodiment.

FIG. 11 is a side sectional view showing a light emitting device according to a fifth embodiment. In the following description made with reference to FIG. 11, the same configuration as that of the above-described embodiment will be understood by making reference to the above description.

Referring FIG. 11, the light emitting device includes a light emitting structure 10 having a plurality of semiconductor layers 11, 12, and 13, a barrier layer 23 under the light emitting structure 10, a first electrode layer 170 having a reflective layer 167 disposed under the light emitting structure 10 and disposed inward from the barrier layer 23, and a second electrode layer 92A on the light emitting structure 10.

The first electrode layer 170 may include a first contact layer 165, the reflective layer 167, and a capping layer 169. The first electrode layer 170 may include the barrier layer 23. A first contact layer 165 is disposed between the reflective layer 167 and the second semiconductor layer 13 and the reflective layer 167 is disposed between the first contact layer 165 and the capping layer 169. The reflective layer 167 may include a material or metal that causes migration. The reflective layer 167 may be metal that causes migration by electrolyte ions.

The protective layer 163 may be disposed on the bottom surface of the light emitting structure 10, may make contact with the bottom surface of the second semiconductor layer 13 and the first contact layer 165, and may be spaced apart from the reflective layer 167.

The barrier layer 23 may be disposed outside the reflective layer 167. The barrier layer 23 may be disposed in a region, which does not overlap the reflective layer 167 in the vertical direction, under the light emitting structure 10. The barrier layer 23 may be disposed under the first contact layer 165. The barrier layer 23 may be disposed in a region, which overlaps with the first contact layer 165 in the vertical direction, under the light emitting structure 10.

The barrier layer 23 may be disposed along an outer peripheral portion of the reflective layer 167. The barrier layer 23 may be disposed more adjacent to the sidewall of the light emitting structure 10 when compared with the reflective layer 167 and may be disposed along the lateral side of the light emitting structure 10. The barrier layer 23 may be a continuous loop shape, ring shape, or frame shape, but the embodiment is not limited thereto. The barrier layer 23 may prevent moisture from infiltrating from the outside. The barrier layer 23 may be disposed outside the reflective layer 167 to prevent migration of the reflective layer 167 or the material constituting the reflective layer 17. In this case, the migration direction of the material constituting the reflective layer 167 or the reflective layer 17 may be the outward direction of the light emitting structure 10 or the moisture infiltration direction. Accordingly, the light emitting device having the barrier layer 23 may prevent reliability from being lowered due to moisture, and may prevent a light output from being reduced.

The barrier layer 23 may be disposed between the first contact layer 165 and the capping layer 169. The barrier layer 23 may make contact with the top surface of the capping layer 169 and the bottom surface of the first contact layer 165 in a region which overlaps with the light emitting structure 10 in the vertical direction. Accordingly, the barrier layer 23 may prevent the reflective layer 167 from moving in the outward direction at the interfacial surface between the first contact layer 165 and the capping layer 169.

The barrier layer 23 may be thicker than the reflective layer 167, and the lower portion of the barrier layer 23 may protrude toward the capping layer 169. Accordingly, when the lower portion of the barrier layer 23 makes contact with the capping layer 169, the contact area between the barrier layer 23 and the capping layer 169 may be increased by the protruding structure. The barrier layer 23 may prevent the migration of the reflective layer 167 or the material constituting the reflective layer 167.

The barrier layer 23 may be formed of a material different from those of the first contact layer 165 and the reflective layer 167. For example, the barrier layer 23 may be at least one of Ni, Ti, Pt, Au, W, and Al and the alloy thereof. The barrier layer 23 may be formed in a single layer or a multi-layer. The barrier layer 23 may include the same metal as that the capping layer 169, but the embodiment is not limited thereto.

Meanwhile, as illustrated in FIGS. 10 and 11, a concavo-convex structure may be formed on at least one of the tops surface and the bottom surface of the barrier layers 21 and 23 of the light emitting device, but the embodiment is not limited thereto.

Hereinafter, a method of manufacturing a light emitting device according to an embodiment will be described with reference to FIGS. 12 to 20.

Figure 12:
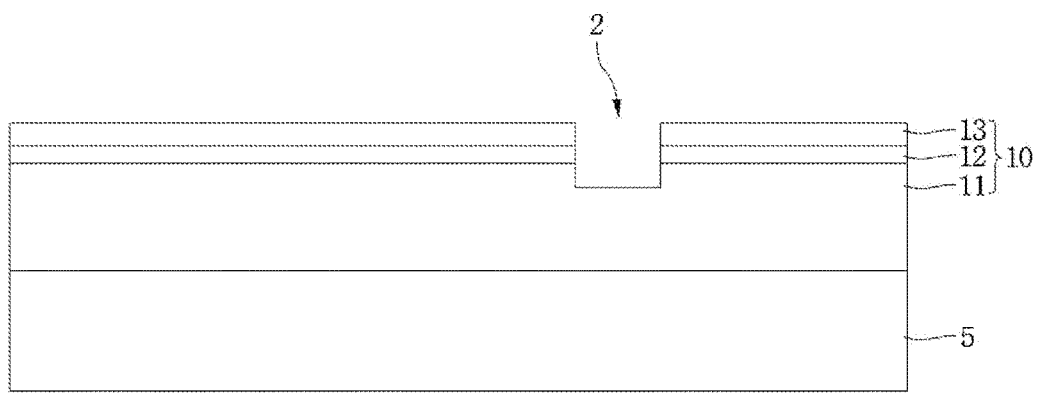
FIGS. 12 to 20 are views showing the manufacturing process of the light emitting device according to the first embodiment.

Referring to FIG. 12, a plurality of semiconductor layers, for example, a first semiconductor layer 11, an active layer 12, and a second semiconductor layer 13 may be formed on a substrate 5. The first semiconductor layer 11, the active layer 12, and the second semiconductor layer 13 may be defined as the light emitting structure 10.

The substrate 5 may include at least one of a conductive material, an insulating material, a transparent material, and a non-transparent material. For example, the substrate 5 may be formed of at least one of a sapphire substrate (Al2O3), SiC, GaAs, GaN, ZnO, Si, GaP, InP and Ge, the embodiment is not limited thereto.

The semiconductor layer grown on the substrate 5 may be formed through a MOCVD method, a CVD method, a PECVD method, an MBE method, an HVPE, and the like. However, the embodiment is not limited thereto.

A buffer layer or a semiconductor layer such as an unintentionally doped semiconductor layer may be further formed between the first semiconductor layer 11 and the substrate 5. The first semiconductor layer 11 includes an n-type semiconductor layer doped with a first conductive dopant such as an n-type dopant. The second semiconductor layer 13 includes a p-type semiconductor layer doped with a second conductive dopant such as a p-type dopant. For another example, the first semiconductor layer 11 may include a p-type semiconductor layer, and the second semiconductor layer 13 may include an n-type semiconductor layer. At least one or both of the first semiconductor layer 11 and the second semiconductor layer 13 may be formed in a multi-layer.

The active layer 12 may be realized with a semiconductor material having a compositional formula of $In_xAl_yGa_{1-x-y}N$ ($0 \leq x \leq 1$, $0 \leq y \leq 1$, $0 \leq x+y \leq 1$). When the active layer 12 is realized in the multi-well structure, the active layer 12 may be realized by stacking a plurality of well layers and a plurality of barrier layers. For example, the active layer 12 may be realized at the cycle of an InGaN well layer/GaN barrier layer.

For another example, the first semiconductor layer 11 may include a p-type semiconductor layer and the second semiconductor layer 13 may include an n-type semiconductor layer. In addition, a semiconductor layer including an n-type semiconductor layer or a p-type semiconductor layer may be further formed on the second semiconductor layer 13. Accordingly, the light emitting structure 10 may have at least one of np, pn, npn, and pnp junction structures. In addition, the doping concentration of impurities in the first and second semiconductor layers 11 and 13 may be uniform or irregular. In other words, the light emitting structure 145 may be variously formed, and the embodiment is not limited thereto.

A first conductive InGaN/GaN superlattice structure or InGaN/InGaN superlattice structure may be formed between the first semiconductor layer 11 and the active layer 12. A second conductive AlGaN layer may be formed between the second semiconductor layer 13 and the active layer 12.

A plurality of recesses 2 may be formed in the light emitting structure 10. The plurality of recesses 2 may be formed at a depth lower than the bottom surfaces of the active layer 12 and the second semiconductor layer 13.

Figure 13:
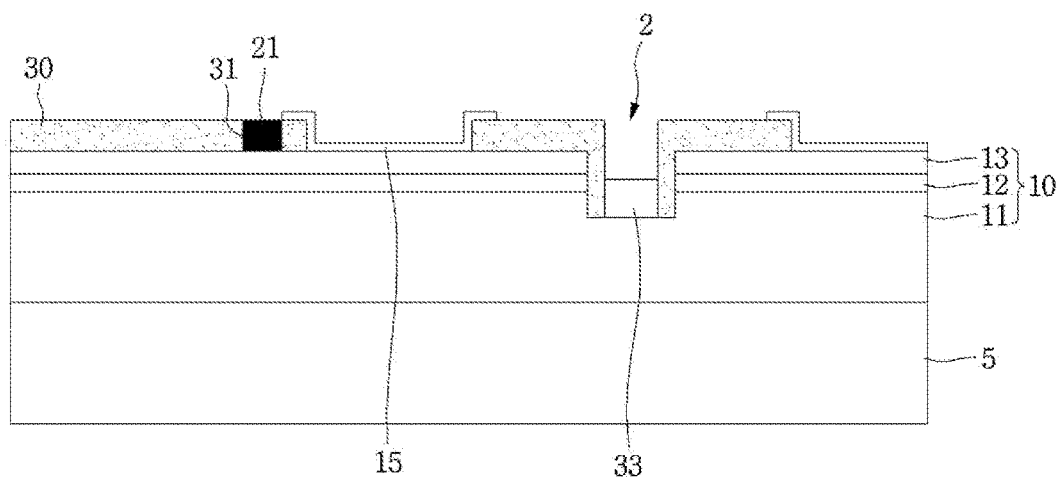
Figure 14:
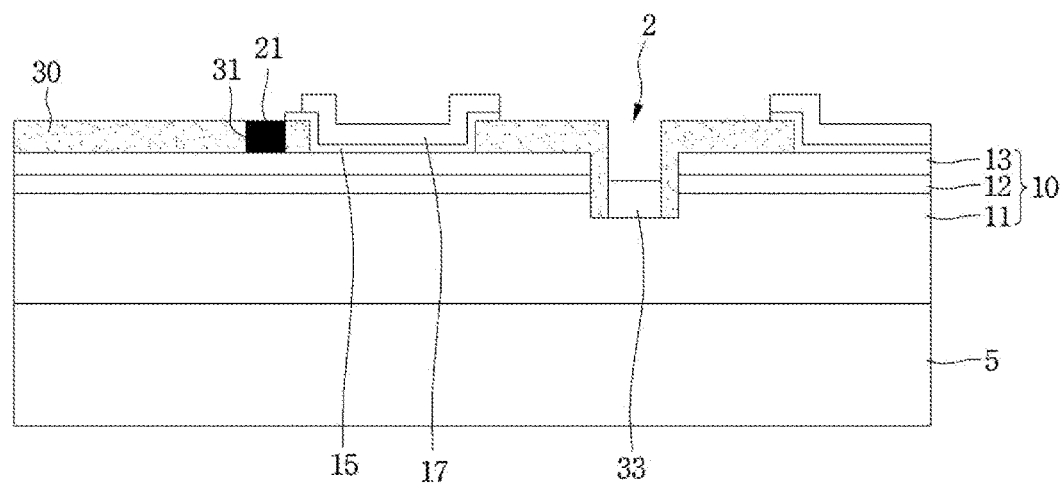

As illustrated in FIGS. 13 and 14, a protective layer 30, a first contact layer 15, and a second contact layer 33 may be formed on the light emitting structure 10. The protective layer 30 may be formed on the top surface of the second semiconductor layer 13 and in the recess 2. When a portion of the protective layer 30 is etched through the etching process, the contact layers 15 and 33 may be formed.

The protective layer 30 may be formed of an insulating material. For example, the protective layer 30 may be implemented with an oxide or a nitride. For example, the protective layer 30 may be formed of at least one selected from the group consisting of SiO2, SixOy, Si3N4, SixNy, SiOxNy, Al2O3, TiO2, and AlN.

The first contact layer 15 and the second contact layer 33 may be deposited with a transparent conductive oxide film, for example. For example, the first contact layer 15 and the second contact layer 33 may include, for example, at least one material individually selected from among Indium Tin Oxide (ITO), Indium Zinc Oxide (IZO), Aluminum Zinc Oxide (AZO), Aluminum Gallium Zinc Oxide (AGZO), Indium Zinc Tin Oxide (IZTO), Indium Aluminum Zinc Oxide (IAZO), Indium Gallium Zinc Oxide (IGZO), Indium Gallium Tin Oxide (IGTO), Antimony Tin Oxide (ATO), Gallium Zinc Oxide (GZO), IZO Nitride (IZON), ZnO, IrOx, RuOx, NiO, Pt, Ag, and Ti.

A barrier layer 21 may be formed in the passivation layer 30. The barrier layer 21 may be formed by performing a deposition processor or a plating process with respect to a region having no the protective layer 30, but the embodiment is not limited thereto.

The barrier layer 21 may be disposed outside the first contact layer 15. The barrier layer 21 may be disposed on the top surface of the light emitting structure 10 and disposed in region which does not overlap with the first contact layer 15 in the vertical direction. The barrier layer 21 may be formed before the protective layer 30 is formed or may be formed in a hole 31 after forming the hole 31 in the protective layer 30, but the embodiment is not limited thereto.

The barrier layer 21 may be disposed adjacent to the sidewall of the light emitting structure 10 and disposed around the top surface of the light emitting structure 10. The barrier layer 21 may be a continuous loop shape, ring shape, or frame shape, but the embodiment is not limited thereto. The barrier layer 21 may prevent moisture from infiltrating from the outside.

Referring to FIG. 14, a reflection layer 17 is formed on the first contact layer 15 and the protection layer 30. The reflective layer 17 may be formed of a material having a high reflectance. For example, the reflective layer 17 may be formed of a metal including at least one individually selected from the group consisting of Ag, Ni, Al, Rh, Pd, Ir, Ru, Mg, Zn, Pt, Cu, Au, and Hf or the alloy thereof. The reflective layer 17 may be formed through a deposition process or a plating process. The barrier layer 21 may be disposed outside the reflective layer 17 to prevent migration of the reflective layer 17 or the material constituting the reflective layer 17 after the light emitting device is manufactured. In this case, the migration direction of the reflective layer 17 may be the outward direction of the light emitting structure 10 or the moisture infiltration direction. Accordingly, the light emitting device having the barrier layer 21 may prevent reliability from being lowered due to moisture, and may prevent light output from being reduced.

Figure 15:
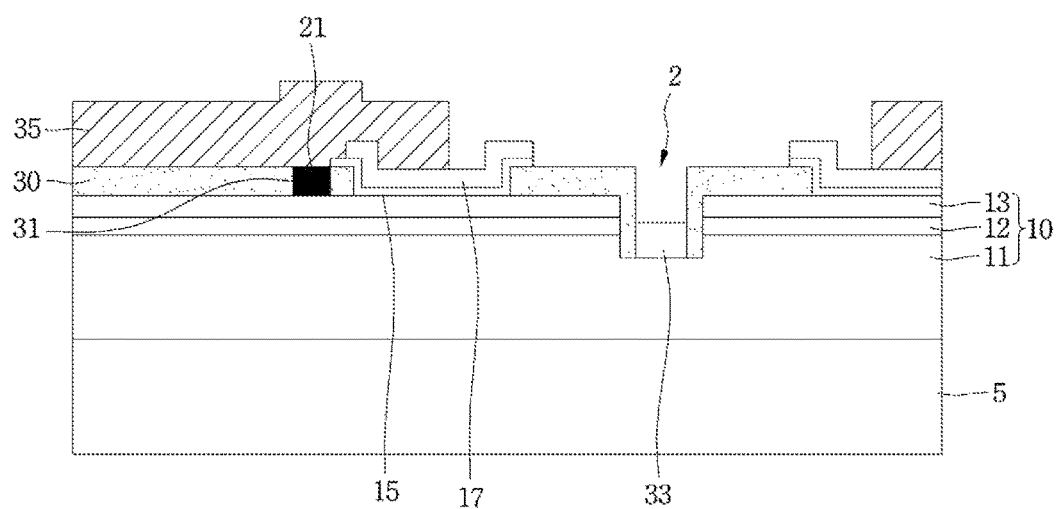
Figure 16:
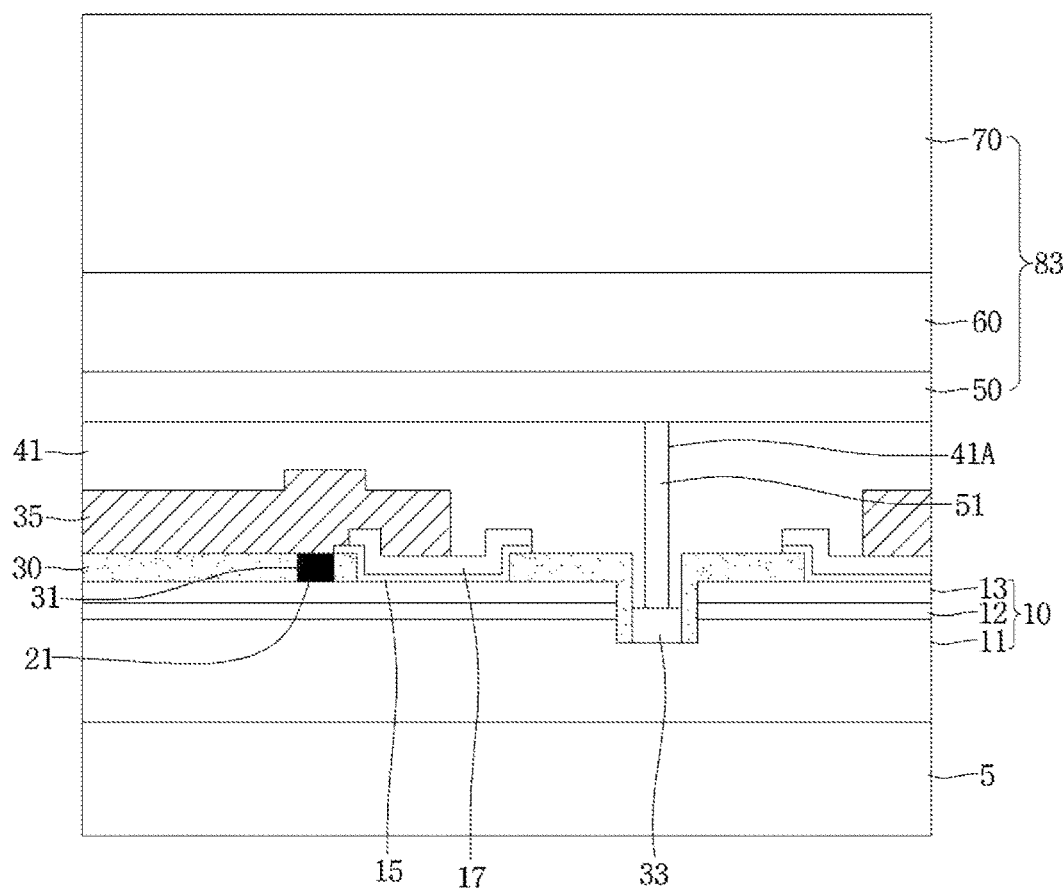

Referring to FIGS. 15 and 16, if a capping layer 35 is deposited on the reflective layer 17 and the protective layer 30, a portion of the capping layer 35 is formed on the outer portion of the protective layer 30.

An insulating layer 41 may be formed on the protective layer 30, the reflective layer 17, and the capping layer 35. A hole 41A for opening the second contact layer 33 is formed in the insulating layer 41A.

An anti-diffusion layer 50 and a bonding layer 60 are formed on the insulating layer 41. The anti-diffusion layer 50 may have a protrusion 51 making contact with the second contact layer 33 through the hole 41A. In this case, the protrusion 51 may be formed by forming a separate hole after the anti-diffusion layer 50 is formed, but the embodiment is not limited thereto.

A conductive support member 70 may be formed on the bonding layer 60 through a plating process or a deposition process.

Figure 17:
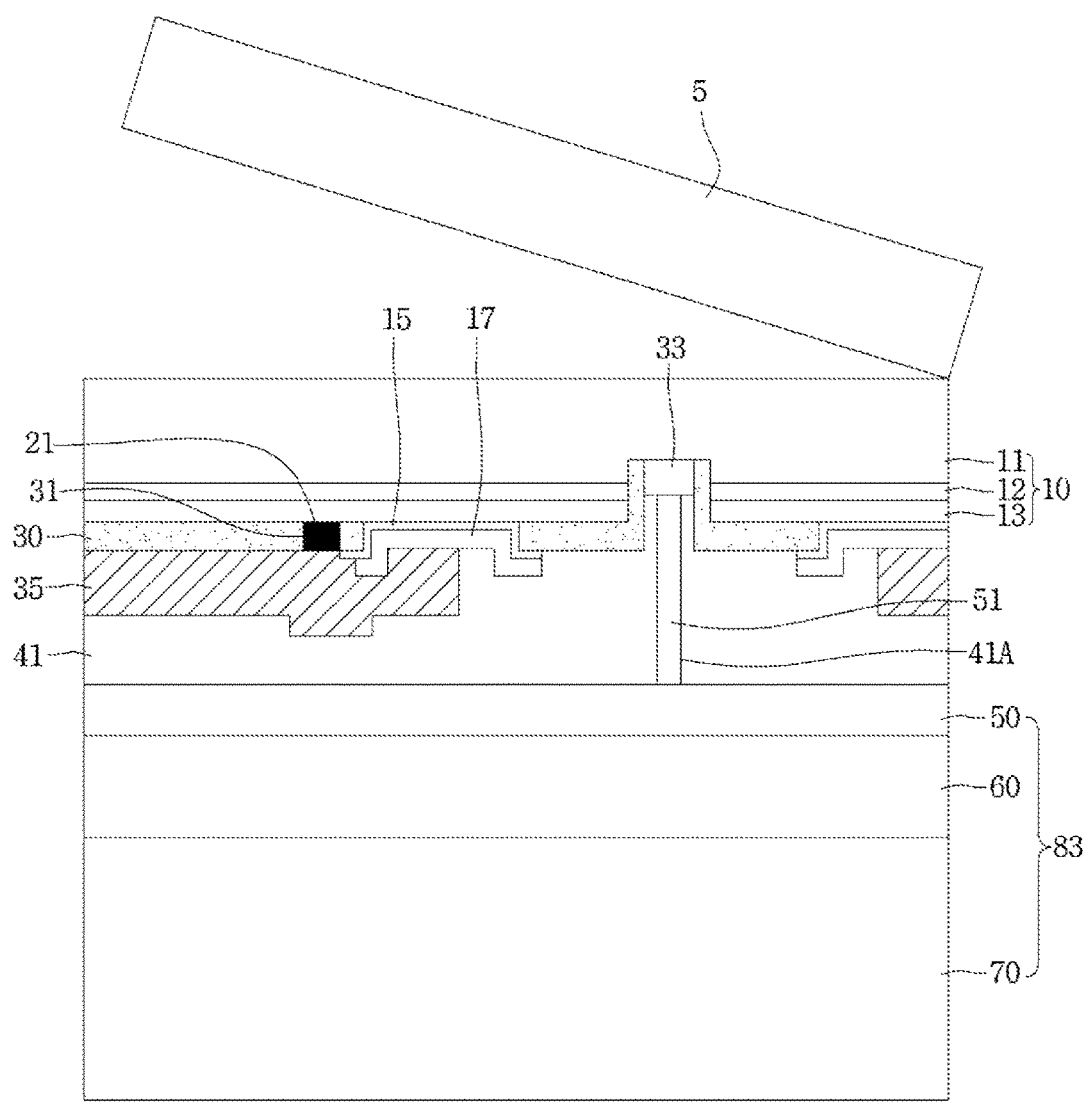

Referring to FIG. 17, the substrate 5 is removed from the first semiconductor layer 11. For example, the substrate 5 may be removed by a laser lift off (LLO) process. The laser lift-off process (LLO) is a process of delaminating the first semiconductor layer 11 from the substrate 5 by irradiating a laser to the bottom surface of the substrate 5.

Figure 18:
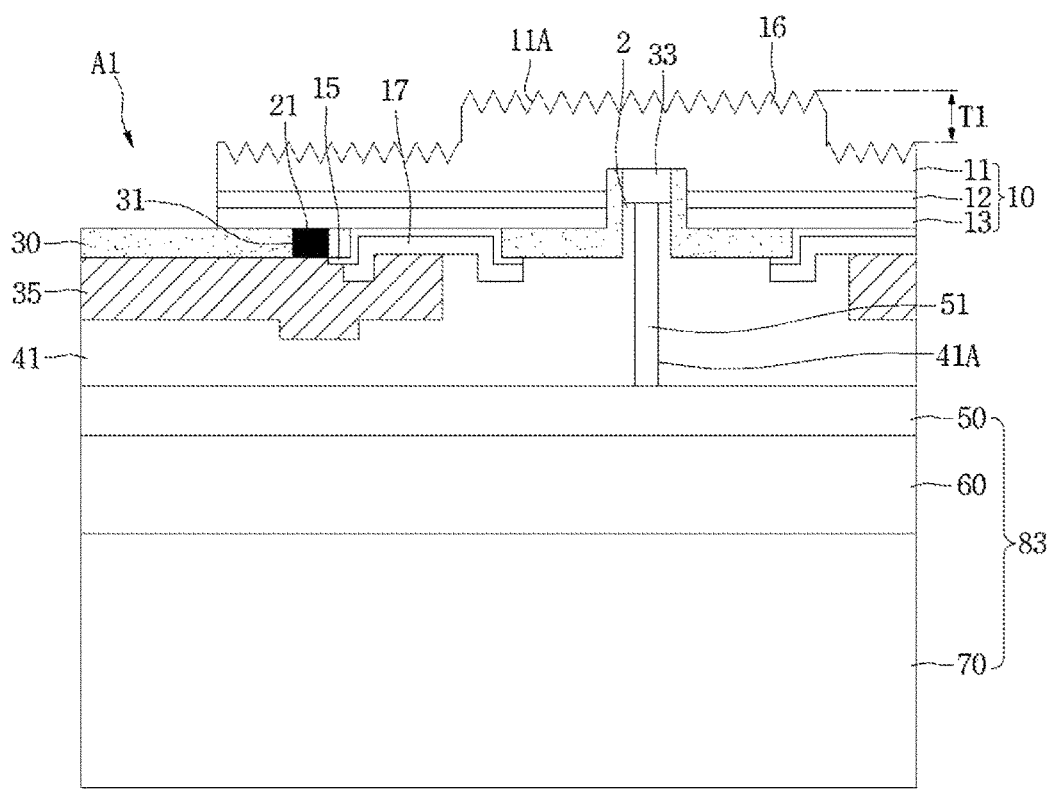

In addition, as illustrated in FIG. 18, after rotating a structure having no substrate, an isolation etching process is performed to etch the lateral side of the light emitting structure 10, and to expose a portion of the protective layer 30. The isolation etching process may be performed through, for example, a dry etching process such as Inductively Coupled Plasma (ICP), but the embodiment is not limited thereto. Through the isolation etching process, adjacent light emitting structures 10 can be separated from each other.

The first semiconductor layer 11 of the light emitting structure 10 may be etched to form a protrusion 16 protruding at a predetermined height T1. Here, the protrusion 16 may be a first conductive semiconductor layer or an undoped semiconductor layer, but the embodiment is not limited thereto. The protrusion 16 may be removed.

The light emitting structure 10 may include a first conductive-first semiconductor layer 11, an active layer 12, and a second-conductive second semiconductor layer 13.

Figure 19:
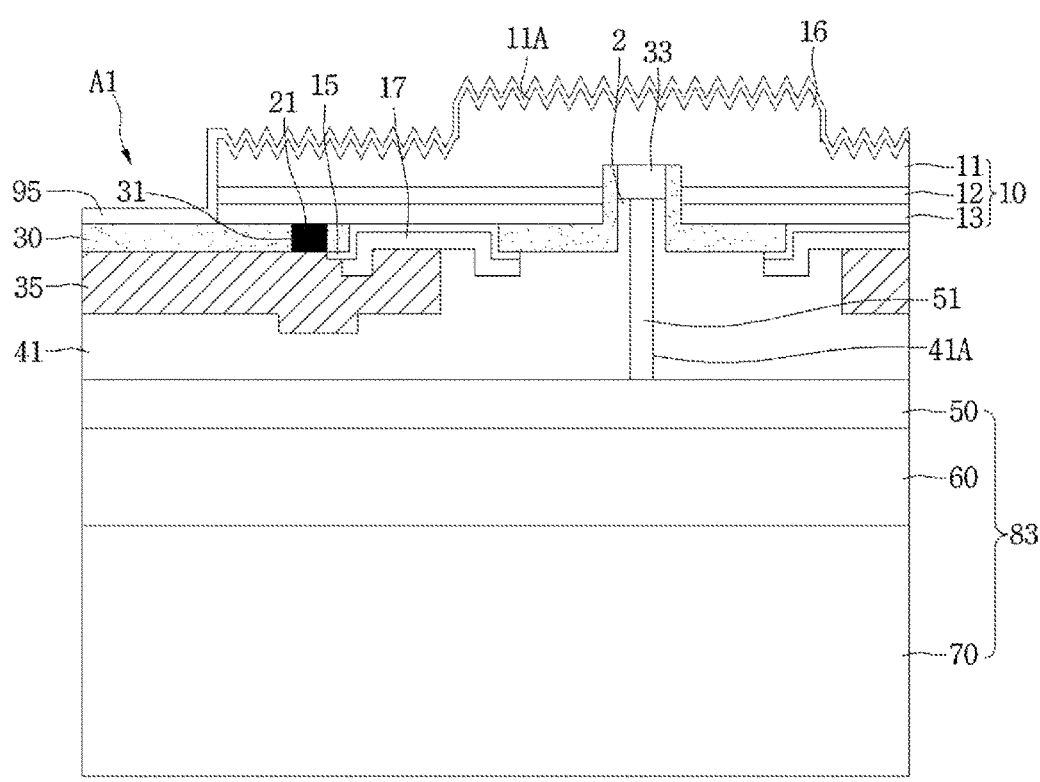

As illustrated in FIGS. 18 and 19, a concavo-convex structure 11A may be formed on the top surface of the light emitting structure 10. The concavo-convex structure 11A provided in the light emitting structure 10 may be formed through, for example, a photo electro chemical (PEC) etching process. Accordingly, according to the embodiment, the external light extraction effect may be enhanced.

Figure 20:
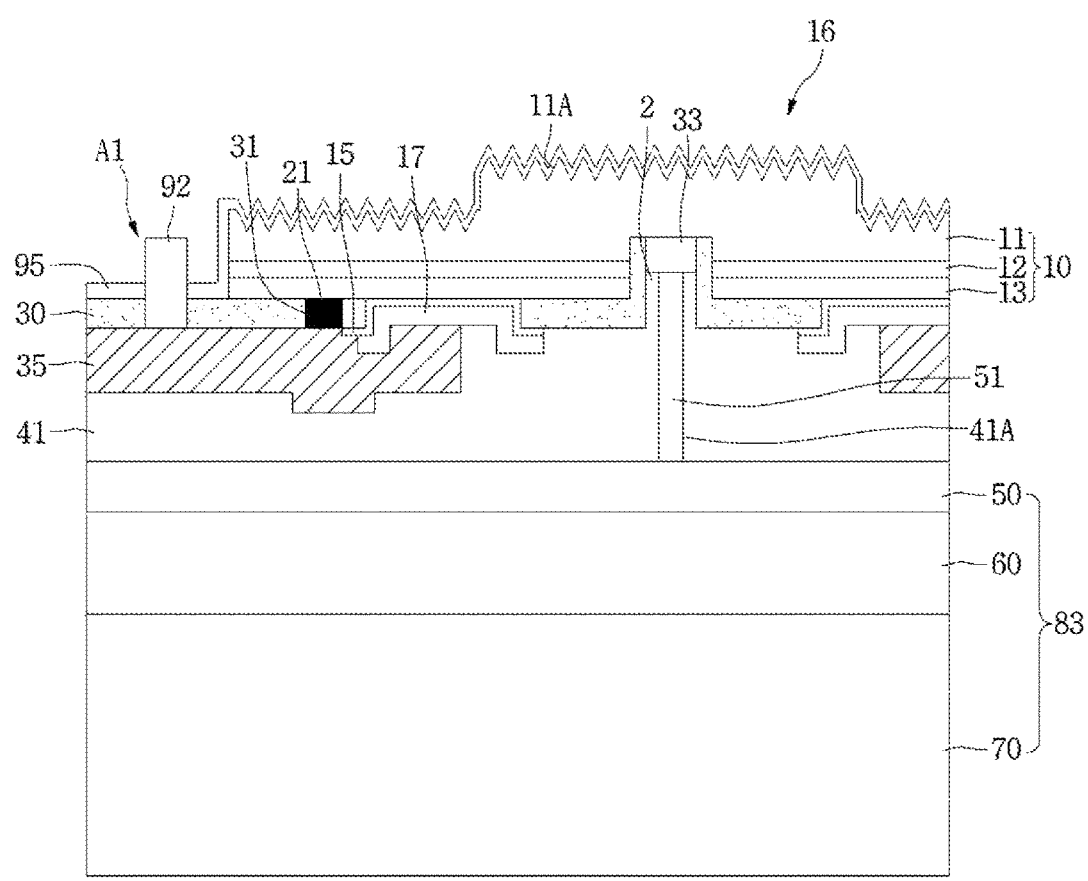

As illustrated in FIG. 20, a region of the capping layer 35 is exposed by partially etching the protective layer 30 outside the sidewall of the light emitting structure 10. Thereafter, the pad 92 is formed on the exposed region of the capping layer 35. Accordingly, the pad 92 may be electrically connected with the capping layer 35.

Meanwhile, in the light emitting device according to the embodiment, a passivation layer 95 may be formed along the surface of the light emitting structure 10 and around the pad 92. The passivation layer 95 may protect the light emitting structure 10. The passivation layer 95 may insulate the pad 92 from the light emitting structure 10.

The passivation layer 95 may be implemented of, for example, an oxide or a nitride. For example, the passivation layer 95 may be formed of at least one selected from the group consisting of SiO2, SixOy, Si3N4, SixNy, SiOxNy, Al2O3, TiO2, and AlN. Meanwhile, the passivation layer 95 may be omitted according to design.

In addition, in the light emitting device according to the embodiment, a phosphor layer (not shown) may be formed on the light emitting structure 10. The manufacturing process described above has been described for the illustrative purpose, and the manufacturing process may be variously modified depending on the design and the purpose.

That is, the light emitting device according to the embodiment may include a plurality of light emitting structures that can be individually driven in one device. Although the embodiment has been described in that one light emitting structure is disposed in one light emitting device, two or more light emitting structures may be disposed in one light emitting device or may be implemented such that the light emitting structures are individually driven.

The light emitting device may be packaged and then mounted on a board or mounted on a board. Hereinafter, a light emitting device package or a light emitting module having the light emitting device of the above-described embodiment (s) will be described.

Figure 21:
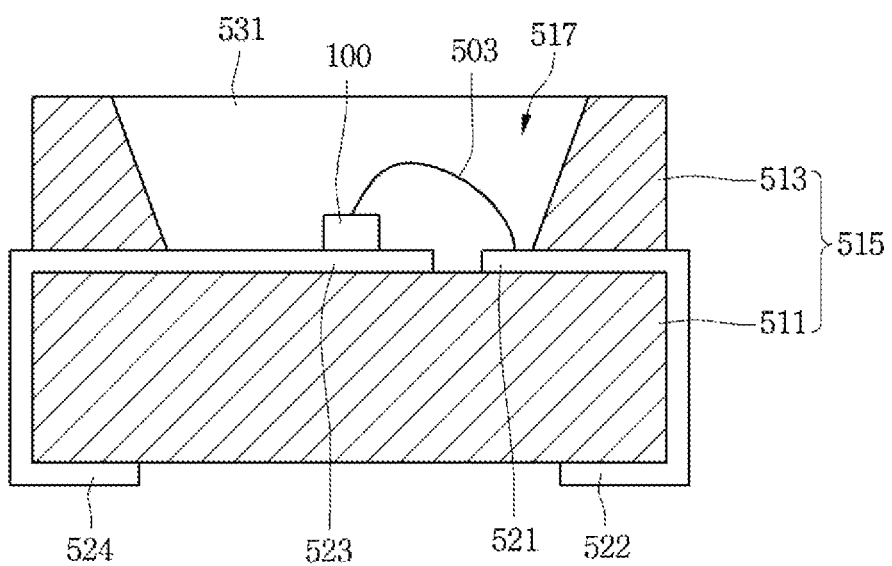
FIG. 21 is a side sectional view having a light emitting device package including the light emitting device according to an embodiment.

FIG. 21 is a sectional view showing a light emitting device package according to the embodiment.

Referring to FIG. 21, the light emitting device package (500) includes a body 515, plurality lead electrodes 521 and 523 disposed on the body 515, a light emitting device 100 according to the embodiment which is disposed on the body 101 and connected to the lead electrodes 521 and 523, and a molding member 531 surrounding the light emitting device 100.

The body 515 may be formed of a conductive substrate such as silicon, a synthetic resin material such as Polyphthalamide (PPA), a ceramic substrate, an insulating substrate, or a metal substrate (e.g., MCPCB-Metal core PCB). The inclined surface of the body 515 may be formed around the light emitting device 100 by a structure of a cavity 517. An outer surface of the body 515 may be formed with a vertical or inclined shape. The body 515 may include a reflective portion 513 having a concave cavity 517 opened at the top surface thereof and a supporting portion 511 supporting the reflective portion 513.

The lead frames 521 and 523 and the light emitting device 100 are disposed in the cavity 517 of the body 515. The plurality of lead frames 521 and 523 include a first lead frame 521 and a second lead frame 523 spaced apart from each other at the bottom surface of the cavity 517. The light emitting device 100 may be disposed on the second lead frame 523 and may be connected to the first lead frame 521 by a connecting member 503. The first lead frame 521 and the second lead frame 523 are electrically separated from each other to provide power to the light emitting device 100. The connecting member 503 may include a wire. In addition, the first lead frame 521 and the second lead frame 523 may reflect light generated from the light emitting device 100 to increase light efficiency. For this purpose, a separate reflective layer may be formed on the first lead frame 521 and the second lead frame 523, but the present invention is not limited thereto. In addition, the first and second lead frames 521 and 523 may serve to discharge the heat generated from the light emitting device 100 to the outside. A lead portion 522 of the first lead frame 521 and a lead portion 524 of the second lead frame 523 may be disposed on the lower surface of the body 515.

The first and second lead frames 521 and 523 may be formed of a metal material such as titanium, copper, nickel, gold, chromium, tantalum, and may include at least one of platinum (Pt), tin (Sn), silver (Ag), and phosphorus (P). In addition, the first and second lead frames 521 and 523 may have a single-layer structure or a multi-layer structure, but the present invention is not limited thereto.

The molding member 531 may include a resin material such as silicone or epoxy, and may surround the light emitting device 100 to protect the light emitting device 100. The molding member 531 may include a phosphor to change the wavelength of light emitted from the light emitting device 100. The phosphor may be selectively formed from YAG, TAG, Silicate, Nitride, and Oxy-nitride based materials. The phosphor includes at least one of a red phosphor, a yellow phosphor, and a green phosphor. The upper surface of the molding member 531 may be flat, concave or convex.

A lens may be disposed on the molding member 531, and the lens may be formed in contact with the molding member 531 or in a non-contact manner. The lens may comprise a concave or convex shape. The upper surface of the molding member 531 may be flat, convex or concave, but is not limited thereto.

A plurality of light emitting devices or light emitting device packages according to the embodiments may be arrayed on a substrate, and a lens, a light guide plate, a prism sheet, a diffusion sheet, etc., which are optical members, may be disposed on the light path of the light emitting device package. Such a light emitting device package, a substrate, and an optical member can function as a light unit. The light unit may be implemented as a top view or a side view type and may be provided in a display device such as a portable terminal and a notebook computer, or may be variously applied to a lighting device and a pointing device. Another embodiment can be realized by a lighting device including the light emitting device or the light emitting device package described in the above embodiments. For example, the lighting device may include a lamp, a streetlight, an electric signboard, and a headlight.

The features, structures, effects and the like described in the embodiments are included in at least one embodiment of the present invention and are not necessarily limited to only one embodiment. Further, the features, structures, effects, and the like illustrated in the embodiments can be combined and modified by other persons having ordinary skill in the art to which the embodiments belong. Therefore, it is to be understood that the present invention is not limited to these embodiments.

While the invention has been shown and described with reference to certain preferred embodiments thereof, it will be understood by those skilled in the art that various changes in form and details may be made therein without departing from the spirit and scope of the invention as defined by the appended claims. It can be seen that various modifications and applications are possible. For example, each component specifically shown in the embodiments can be modified and implemented. It is to be understood that the present invention may be embodied in many other specific forms without departing from the spirit or essential characteristics thereof.

INDUSTRIAL APPLICABILITY

According to the embodiment, the light emitting device and the light emitting device package having the same may be used under the environment strong for moisture.

According to the embodiment, the light emitting device and the light emitting device package having the same may be used for a moisture-resistant light source.

According to the embodiment, the light emitting device may be used for the display device, the lamp for the vehicle, and various types of lighting devices.

The invention claimed is:

1. A light emitting device comprising:
a light emitting structure including a first semiconductor layer, an active layer under the first semiconductor layer, and a second semiconductor layer under the active layer;
a first electrode layer including: a first contact layer disposed under the light emitting structure; a reflective layer disposed under the first contact layer; and a capping layer disposed under the reflective layer;
a second electrode layer electrically connected to the first semiconductor layer;
a protective layer disposed at an outer peripheral portion of a region between the capping layer and the light emitting structure;
a passivation layer disposed on a surface of the light emitting structure;
a first barrier layer disposed at an outer peripheral portion of the reflective layer; and
a support member disposed under the capping layer,
wherein the first barrier layer includes a metal,
wherein an outer portion of the capping layer is disposed outside a sidewall of the light emitting structure,
wherein the protective layer is disposed on the outer portion of the capping layer,
wherein the passivation layer is disposed on the protective layer,
wherein the protective layer includes an inner portion overlapping with the light emitting structure and an outer portion overlapping with the outer portion of the capping layer, and
wherein the first barrier layer is disposed in the inner portion of the protective layer.

2. The light emitting device of claim 1, wherein the first barrier layer contacts a bottom surface of the light emitting structure and a top surface of the capping layer.

3. The light emitting device of claim 1, further comprising a second barrier layer disposed between the first contact layer and the capping layer,
wherein the second barrier layer includes a metal, and
wherein the first barrier layer is formed in a loop shape, a ring shape, or a frame shape along an outer peripheral portion of a bottom surface of the light emitting structure.

4. The light emitting device of claim 3, wherein the second barrier layer contacts the first contact layer, the capping layer, and the reflective layer.

5. The light emitting device of claim 1, wherein the reflective layer includes metal causing migration, and
wherein the first barrier layer includes metal different from the metal of the reflective layer.

6. The light emitting device of claim 5, wherein the first barrier layer includes at least one of Ni, Ti, Pt, Au, W, Zn, Ag, and Al, and
wherein the first barrier layer has a thickness equal to or greater than a thickness of the protective layer.

7. The light emitting device of claim 1, wherein the second electrode layer is disposed on a top surface of the first semiconductor layer, and
wherein the support member includes a conductive member electrically connected with the first electrode layer.

8. The light emitting device of claim 7, wherein the reflective layer includes metal causing migration, and
wherein the first barrier layer includes metal including the metal of the reflective layer.

9. The light emitting device of claim 1, wherein the first barrier layer includes a concavo-convex structure formed on at least one of a top surface and a bottom surface thereof.

10. A light emitting device comprising:
a light emitting structure including a first semiconductor layer, an active layer under the first semiconductor layer, and a second semiconductor layer under the active layer;
a first electrode layer including: a first contact layer disposed under the light emitting structure; a reflective layer disposed under the first contact layer; and a capping layer disposed under the reflective layer;

a second electrode layer electrically connected with the first semiconductor layer under the first semiconductor layer;

an insulating layer between the first electrode layer and the second electrode layer;

a protective layer disposed at an outer peripheral portion of a region between the capping layer and the light emitting structure; and a first barrier layer disposed at an outer peripheral portion of the reflective layer, wherein the first barrier layer includes metal different from metal of the reflective layer, wherein the first barrier layer has a thickness equal to or greater than a thickness of the protective layer, wherein the protective layer includes an inner portion overlapping with the light emitting structure and an outer portion overlapping with an outer portion of the capping layer, and wherein the first barrier layer is disposed in the inner portion of the protective layer.

11. The light emitting device of claim 10, further comprising a passivation layer disposed on a surface of the light emitting structure, wherein the outer portion of the capping layer is disposed outside a sidewall of the light emitting structure, wherein the protective layer is disposed on the outer portion of the capping layer, and wherein the passivation layer is disposed on the protective layer.

12. The light emitting device of claim 10, wherein the first barrier layer contacts a bottom surface of the light emitting structure and a top surface of the capping layer.

13. The light emitting device of claim 10, wherein the thickness of the first barrier layer is thicker than a thickness of the reflective layer, wherein the first barrier layer has a width of range of 2.5 µm to 3.5 µm, and wherein the first barrier layer includes at least one of Ni, Ti, Pt, Au, W, Zn, Ag, and Al.

14. The light emitting device of claim 10, wherein the second electrode layer includes: an anti-diffusion layer between the insulating layer and a support member; and a bonding layer between the anti-diffusion layer and the support member, and wherein the light emitting device includes a pad on an outer contact part of the capping layer.

15. The light emitting device of claim 10, wherein the first barrier layer includes a concavo-convex structure formed on at least one of a top surface and a bottom surface thereof.

16. The light emitting device of claim 10, wherein the first barrier layer is disposed between the light emitting structure and the capping layer, and wherein the light emitting device includes a second barrier layer disposed between the first contact layer and the capping layer.

17. The light emitting device of claim 10, wherein the first barrier layer is formed in a loop shape, a ring shape, or a frame shape along an outer peripheral portion of a bottom surface of the light emitting structure.

18. A light emitting device comprising:

a light emitting structure including a first semiconductor layer, an active layer under the first semiconductor layer, and a second semiconductor layer under the active layer;

a first electrode layer including: a first contact layer disposed under the light emitting structure; a reflective layer disposed under the first contact layer; and a capping layer disposed under the reflective layer;

a second electrode layer electrically connected to the first semiconductor layer;

a protective layer disposed at an outer peripheral portion of a region between the capping layer and the light emitting structure;

a passivation layer disposed on a surface of the light emitting structure;

a barrier layer disposed at an outer peripheral portion of the reflective layer; and a support member disposed under the capping layer, wherein the barrier layer includes a metal, wherein an outer portion of the capping layer is disposed outside a sidewall of the light emitting structure, wherein the protective layer is disposed on the outer portion of the capping layer, wherein the passivation layer is disposed on the protective layer, and wherein the barrier layer is disposed between the first contact layer and the capping layer.

19. The light emitting device of claim 18, wherein the protective layer includes an inner portion overlapping with the light emitting structure and an outer portion overlapping with the outer portion of the capping layer, and wherein the barrier layer is disposed in the inner portion of the protective layer.

20. The light emitting device of claim 18, wherein the barrier layer includes a concavo-convex structure formed on at least one of a top surface and a bottom surface thereof.

* * * * *